United States Patent
Lee et al.

(10) Patent No.: US 9,082,988 B2
(45) Date of Patent: Jul. 14, 2015

(54) ORGANIC LIGHT EMITTING DIODE DEVICE

(71) Applicants: Jae-Yong Lee, Yongin (KR); Jung-Sub Lee, Yongin (KR)

(72) Inventors: Jae-Yong Lee, Yongin (KR); Jung-Sub Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 197 days.

(21) Appl. No.: 13/922,303

(22) Filed: Jun. 20, 2013

(65) Prior Publication Data
US 2014/0239261 A1 Aug. 28, 2014

(30) Foreign Application Priority Data
Feb. 28, 2013 (KR) .................. 10-2013-0022379

(51) Int. Cl.
*H01L 35/24* (2006.01)
*H01L 51/00* (2006.01)

(52) U.S. Cl.
CPC ........ *H01L 51/0067* (2013.01); *H01L 51/0072* (2013.01)

(58) Field of Classification Search
CPC ............ H01L 51/0545; H01L 51/0541; H01L 51/0036; H01L 51/5012; B82Y 10/00
USPC ............................................ 257/40, E51.001
See application file for complete search history.

(56) References Cited

U.S. PATENT DOCUMENTS

2012/0261651 A1  10/2012  Noto et al.

FOREIGN PATENT DOCUMENTS

| JP | 2006-165526 A | 6/2006 |
|---|---|---|
| KR | 10 1993-0020748 A | 10/1993 |
| KR | 10 2012-0075272 A | 7/2012 |
| KR | 10 2012-0085749 A | 8/2012 |

*Primary Examiner* — Anthony Ho
(74) *Attorney, Agent, or Firm* — Lee & Morse, P.C.

(57) ABSTRACT

An organic light emitting diode device includes an anode and a cathode facing each other, and an emission layer interposed between the anode and cathode, the emission layer including a compound represented by the following Chemical Formula 1 and a compound represented by the following Chemical Formula 2:

[Chemical Formula 1]

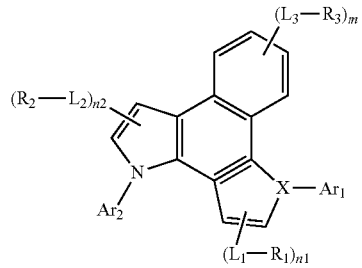

[Chemical Formula 2]

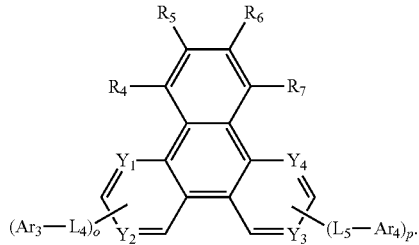

9 Claims, 1 Drawing Sheet

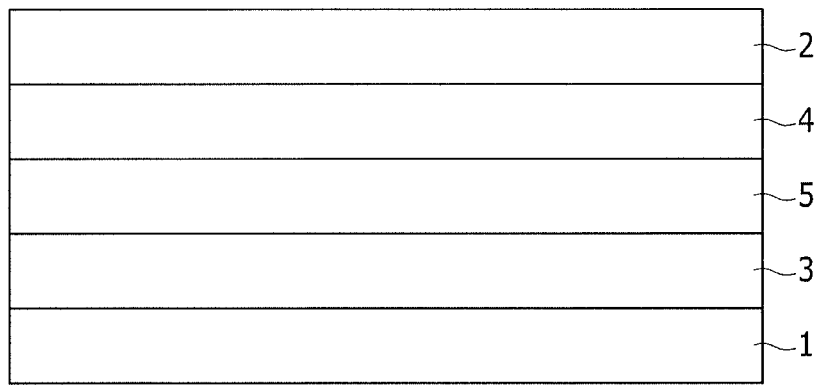

ORGANIC LIGHT EMITTING DIODE DEVICE

CROSS-REFERENCE TO RELATED APPLICATION

This application claims priority to and the benefit of Korean Patent Application No. 10-2013-0022379 filed in the Korean Intellectual Property Office on Feb. 28, 2013, the entire contents of which are incorporated herein by reference.

BACKGROUND

1. Field

Embodiments relate to an organic light emitting diode device.

2. Description of the Related Art

Demands for a reduced size and thickness of a monitor, a television, or the like has promoted replacement of a cathode ray tube (CRT) with a liquid crystal display (LCD). However, the liquid crystal display (LCD) does not only need a separate backlight, as a non-emissive device, but has also a limit in terms of a response speed, a viewing angle, and the like. Recently, as a display device to overcome such limits, an organic light emitting diode device has been highlighted. The organic light emitting diode device is a self-light emitting display device having a wide viewing angle, improved contrasts and a fast response time.

SUMMARY

Embodiments are directed to an organic light emitting diode device, including an anode and a cathode facing each other, and an emission layer interposed between the anode and cathode, the emission layer including a compound represented by the following Chemical Formula 1 and a compound represented by the following Chemical Formula 2:

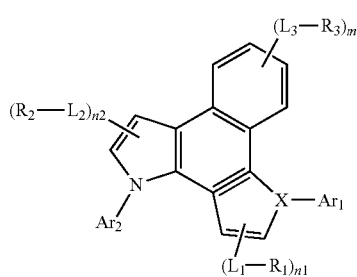

[Chemical Formula 1]

In Chemical Formula 1, each X may independently be oxygen (O), sulfur (S), or nitrogen (N), $L_1$ to $L_3$ may independently be a single bond, a substituted or unsubstituted C6 to C30 arylene group, or a substituted or unsubstituted C2 to C30 heteroarylene group, $R_1$ to $R_3$ may independently be hydrogen, a substituted or unsubstituted C1 to C30 alkyl group, a substituted or unsubstituted C1 to C30 haloalkyl group, a halogen, a cyano group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 alkoxy group, a substituted or unsubstituted C6 to C30 aryloxy group, a substituted or unsubstituted C2 to C30 heteroaryl group, a substituted or unsubstituted C6 to C30 arylthiol group, a substituted or unsubstituted amino group, a substituted or unsubstituted silyl group, a nitro group, or a hydroxy group, $Ar_1$ and $Ar_2$ may independently be a substituted or unsubstituted C1 to C30 alkyl group, a substituted or unsubstituted C1 to C30 haloalkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C1 to C30 alkoxy group, a substituted or unsubstituted C6 to C30 aryloxy group, a substituted or unsubstituted C2 to C30 heteroaryl group, a substituted or unsubstituted C6 to C30 arylthiol group, a substituted or unsubstituted amino group, or a substituted or unsubstituted silyl group, and n1 and n2 indicate ring substitutions and may independently be integers ranging from 0 to 2, and m indicates ring substitutions and may be an integer ranging from 0 to 4,

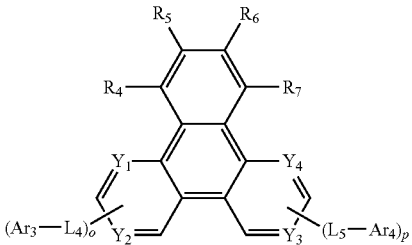

[Chemical Formula 2]

In Chemical Formula 2, $R_4$ to $R_7$ may independently be hydrogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C40 aryl group, a substituted or unsubstituted C2 to C40 heteroaryl group, a substituted or unsubstituted C6 to C40 aryloxy group, a substituted or unsubstituted C1 to C40 alkoxy group, a substituted or unsubstituted C6 to C40 arylamino group, a substituted or unsubstituted C3 to C40 cycloalkyl group, or a substituted or unsubstituted C2 to C40 heterocycloalkyl group, $Y_1$ to $Y_4$ may independently be nitrogen (N) or $CR_8$, wherein $R_8$ is hydrogen, a C1 to C40 alkyl group, a C6 to C40 aryl group, or a C2 to C40 heteroaryl group, $L_4$ and $L_5$ may independently be a single bond, a substituted or unsubstituted C6 to C30 arylene group, or a substituted or unsubstituted C2 to C30 heteroarylene group, $Ar_3$ and $Ar_4$ may independently be a substituted or unsubstituted C6 to C40 aryl group, a substituted or unsubstituted C2 to C40 heteroaryl group, or a substituted or unsubstituted silyl group, and o and p indicate ring substitutions may independently be integers ranging from 0 to 3. o and p may not simultaneously be 0.

Each X may independently be sulfur (S) or nitrogen (N), $L_1$ to $L_3$ may independently be a single bond, a substituted or unsubstituted C6 to C30 arylene group, or a substituted or unsubstituted C2 to C30 heteroarylene group, $R_1$ to $R_3$ may independently be a substituted or unsubstituted C6 to C30 aryl group, a substituted or unsubstituted C2 to C30 heteroaryl group, or a substituted or unsubstituted silyl group, and $Ar_1$ and $Ar_2$ may be a substituted or unsubstituted C6 to C30 aryl group, or a substituted or unsubstituted C2 to C30 heteroaryl group.

All $R_4$ to $R_7$ may be hydrogen, $Y_1$ to $Y_4$ may independently be nitrogen (N) or $CR_8$, wherein $R_8$ may be hydrogen, a C1 to C40 alkyl group, a C6 to C40 aryl group, or a C2 to C40 heteroaryl group, $L_4$ and $L_5$ may independently be a single bond, a substituted or unsubstituted C6 to C30 arylene group, or a substituted or unsubstituted C2 to C30 heteroarylene group, o may be 0 or 1, p may be 1, and $Ar_3$ and $Ar_4$ may independently be a substituted or unsubstituted C6 to C40 aryl group, a substituted or unsubstituted C2 to C40 heteroaryl group, or a substituted or unsubstituted silyl group.

The compound represented by the above Chemical Formula 1 may be at least one of the compounds of the following Group 1:

[Group 1]

1-1

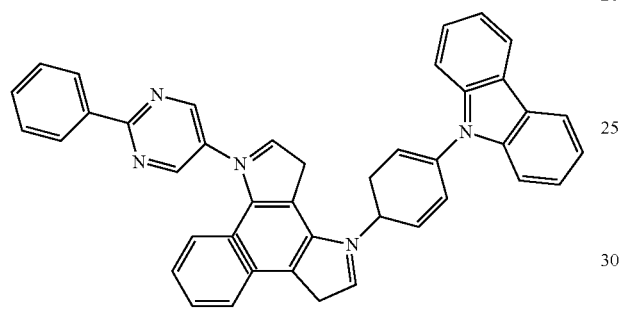

1-2

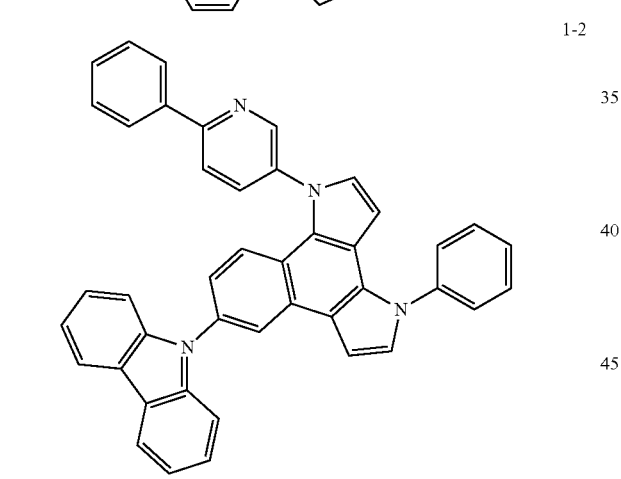

1-3

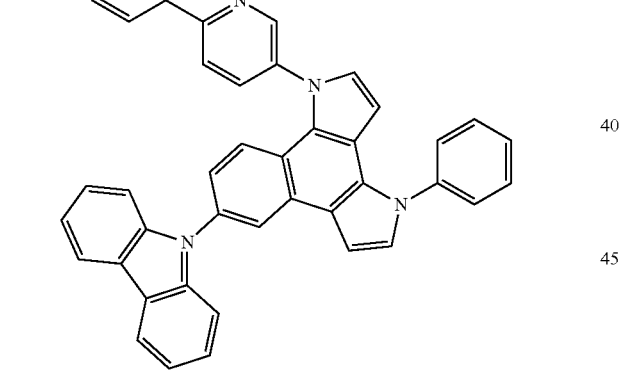

1-4

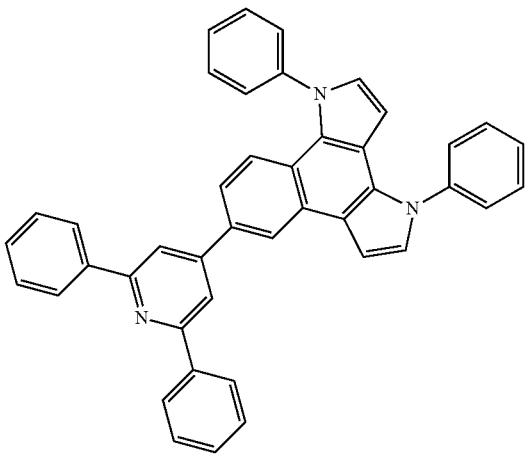

1-5

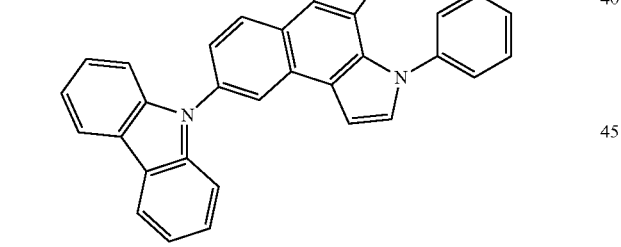

1-6

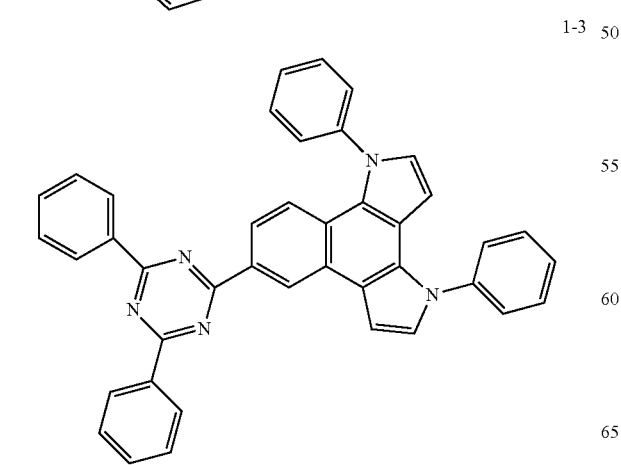

1-7
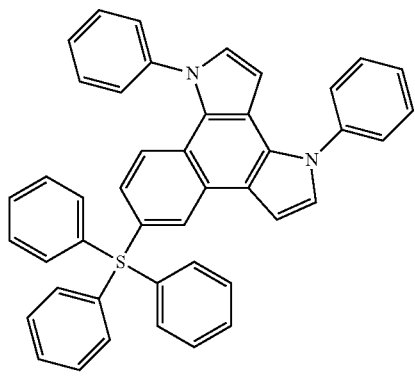
1-8
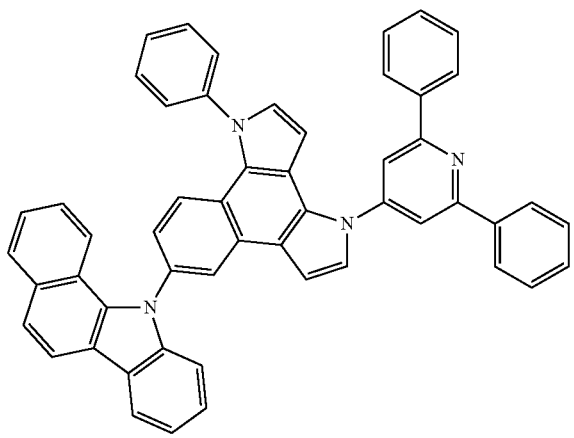
1-9
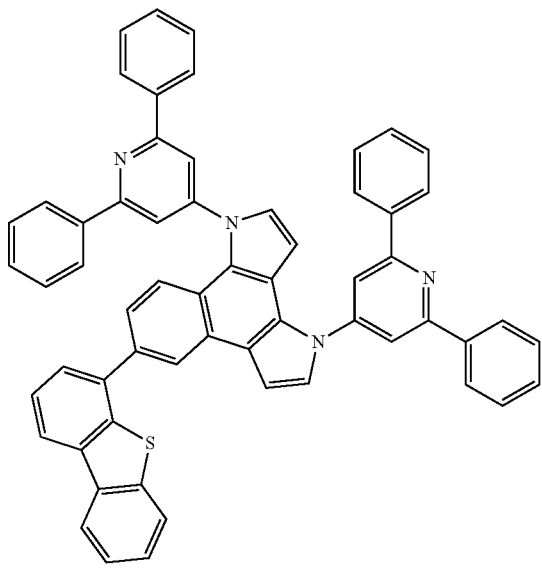
1-10
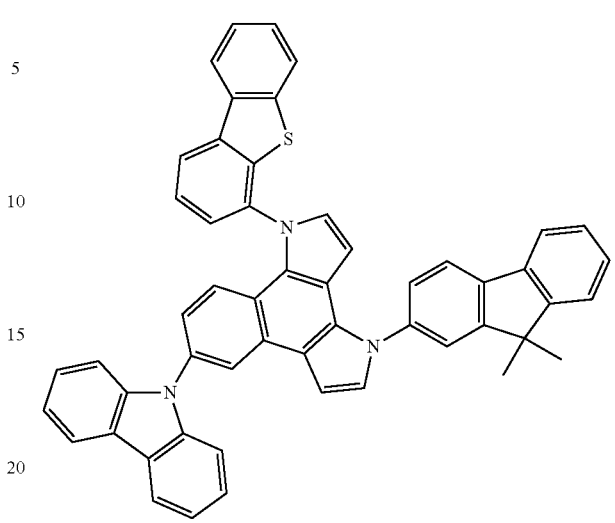
1-11
1-12
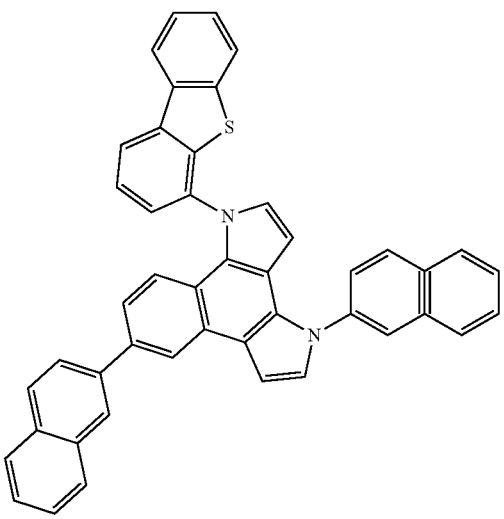

-continued
1-13
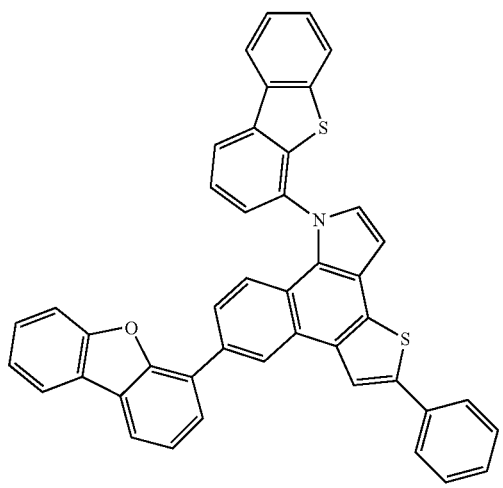
1-16
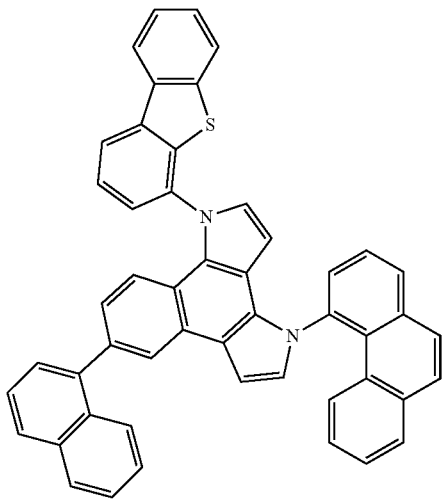
1-14
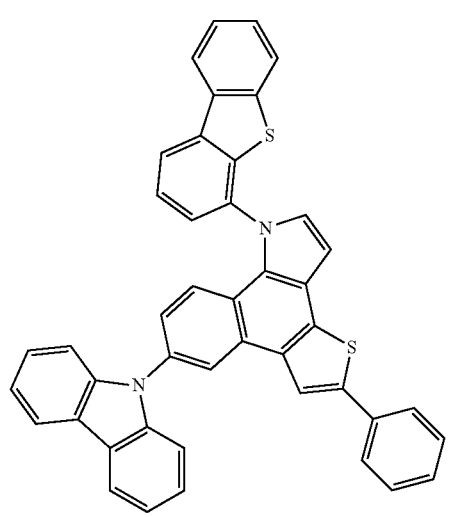
1-17
1-15
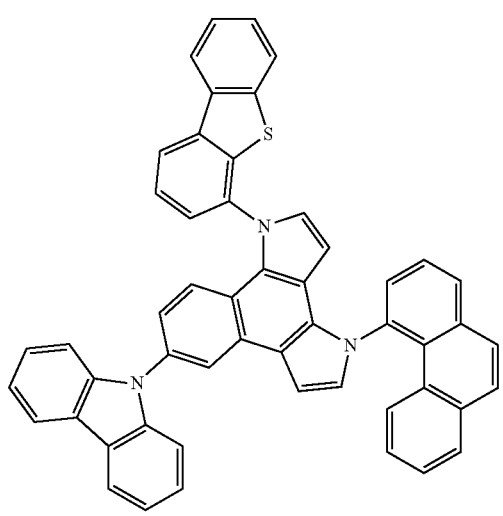
1-18
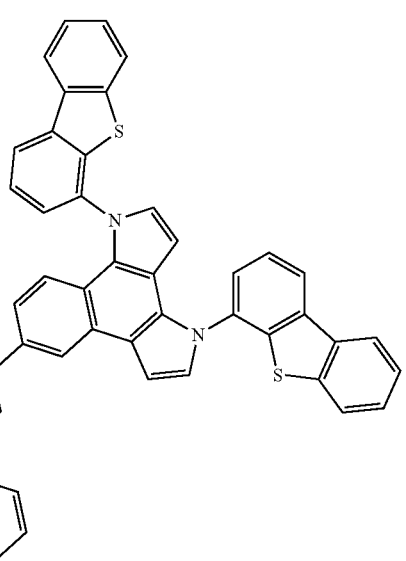

-continued
1-19
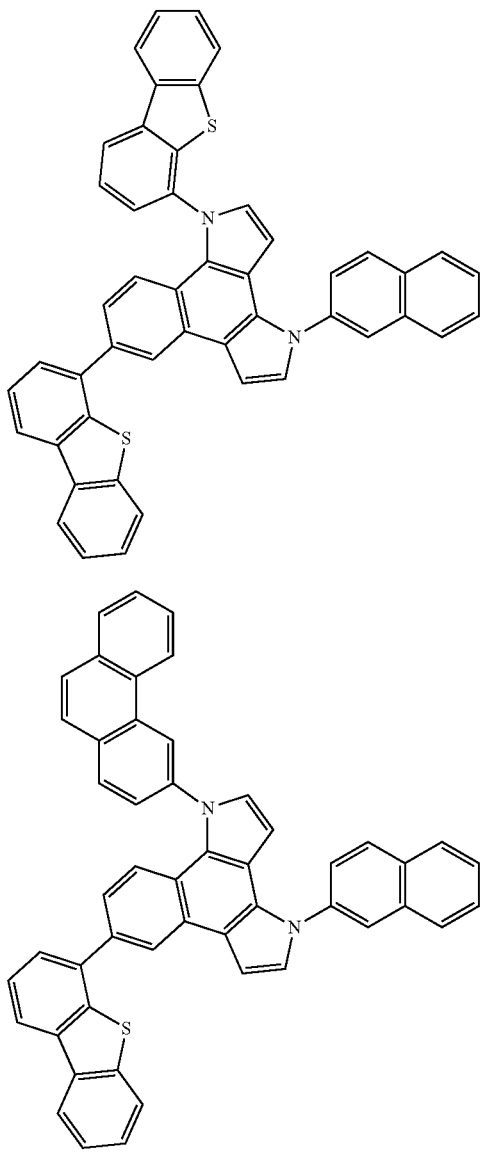
1-20
1-21
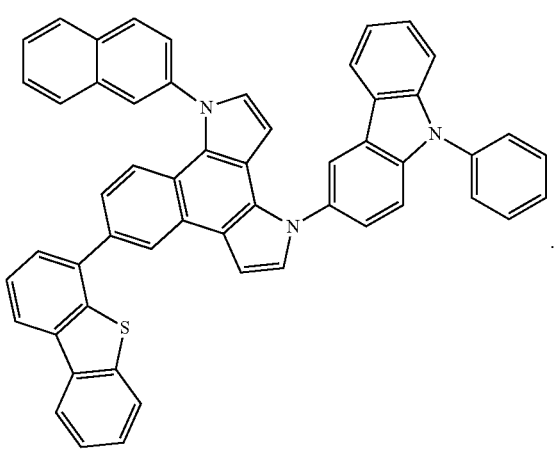
The compound represented by the above Chemical Formula 2 may be at least one of the compounds of the following Group 2:
[Group 2]
2-1
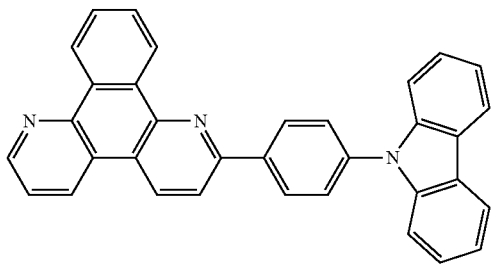
2-2
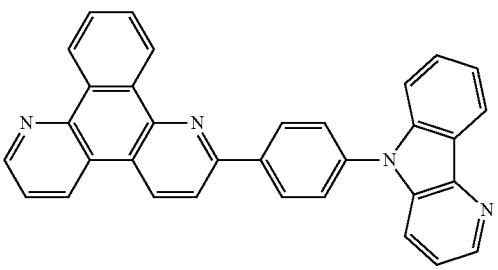
2-3
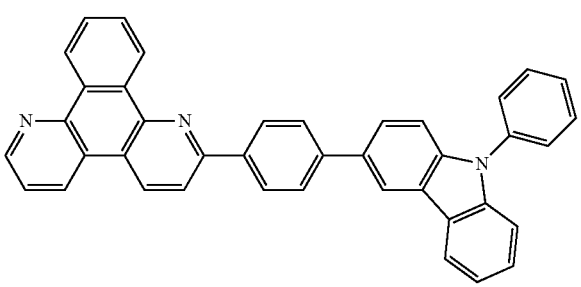
2-4
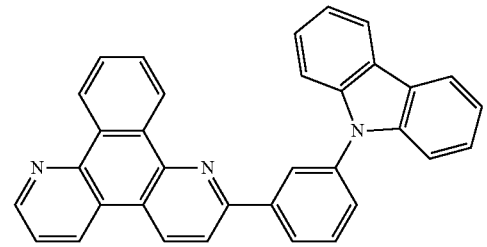
2-5
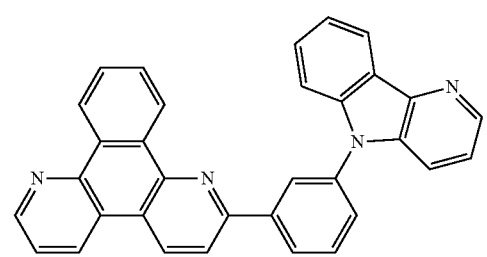

2-6
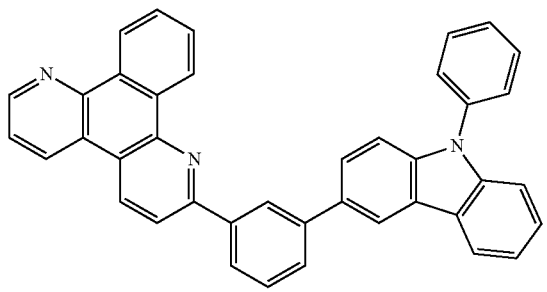
2-11
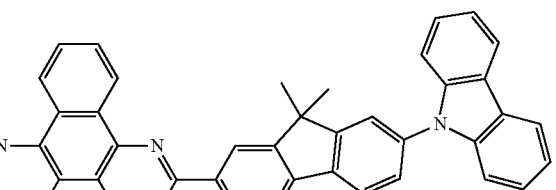
2-7
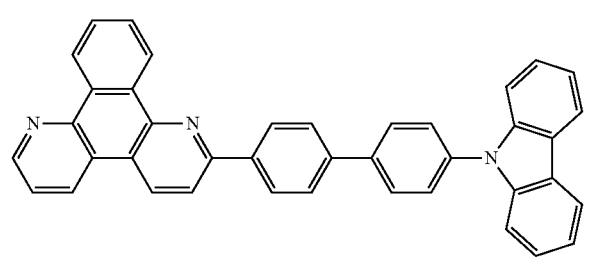
2-12
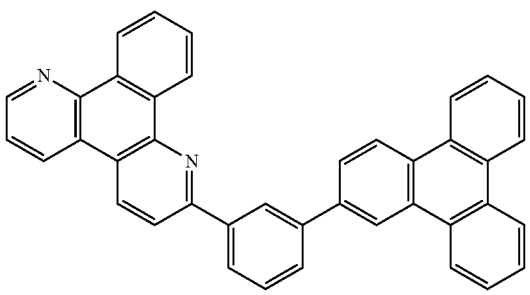
2-8
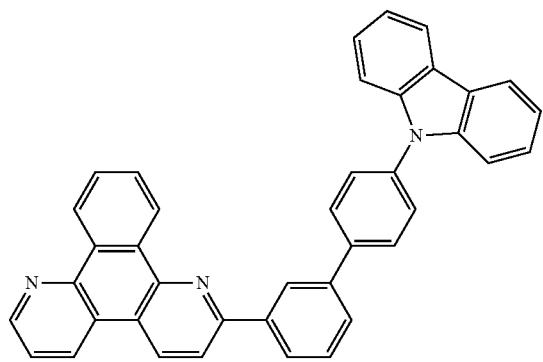
2-13
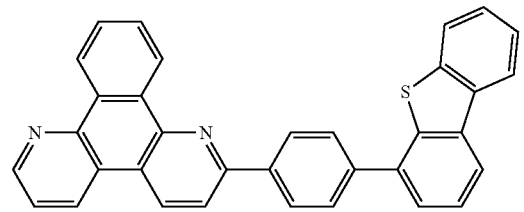
2-9
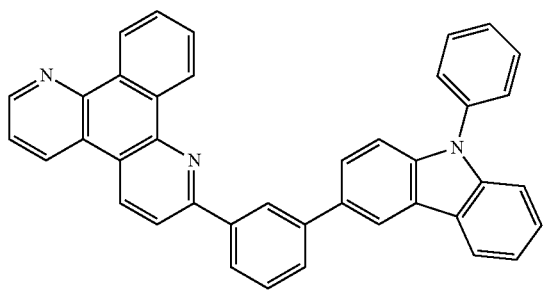
2-14
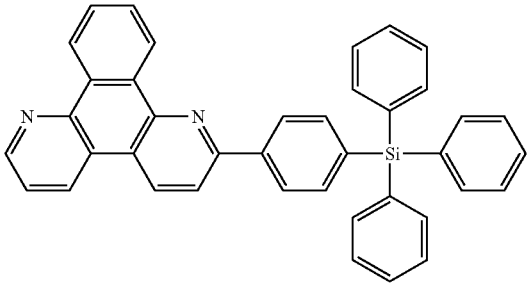
2-10
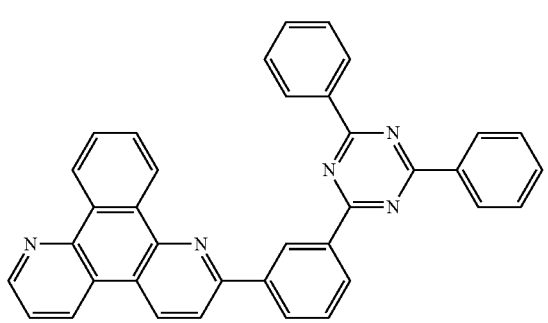
2-15
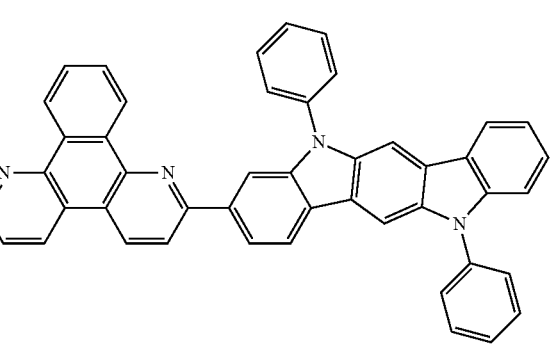

2-16
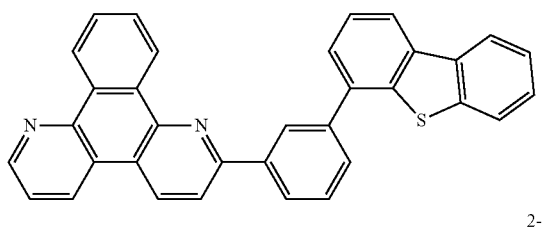
2-16
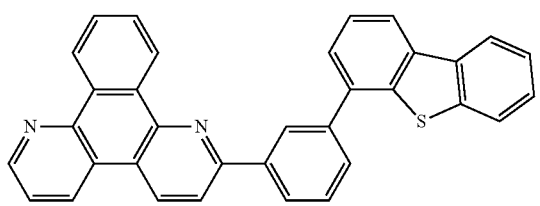
2-17
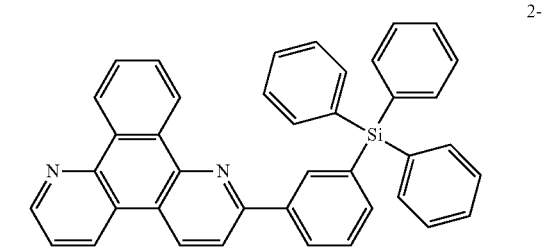
2-18
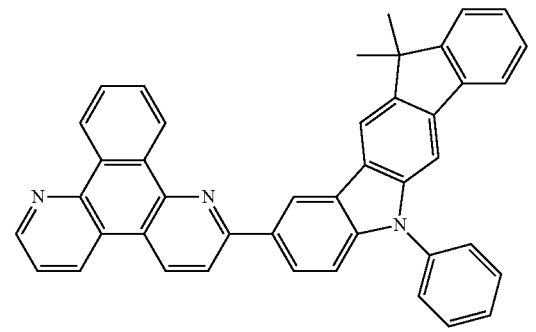
2-19
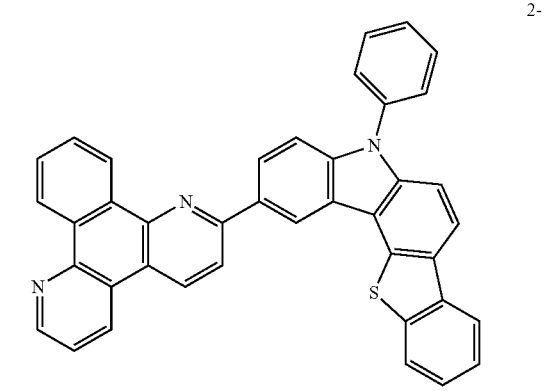
2-20
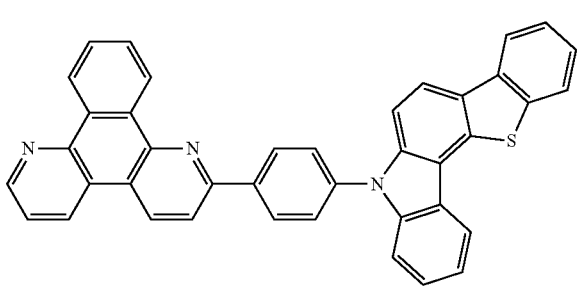
2-21
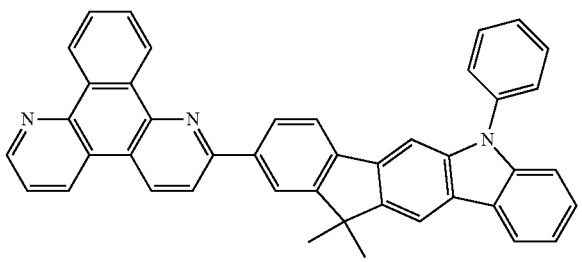
2-22
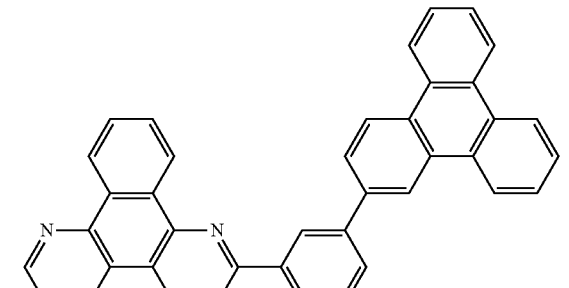
2-23
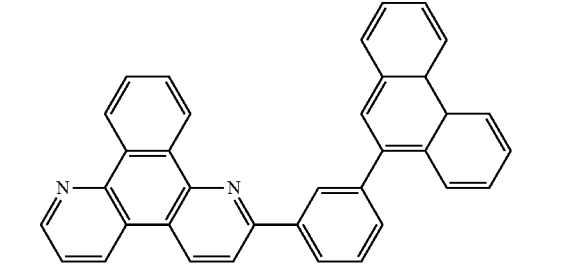
2-24
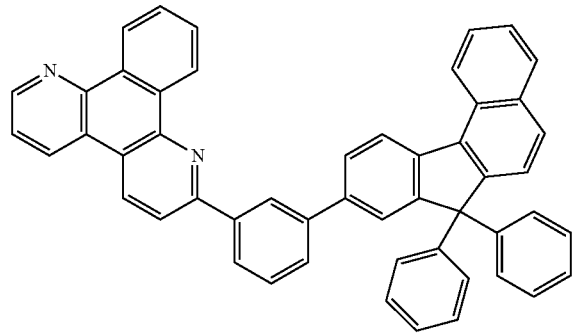

2-25
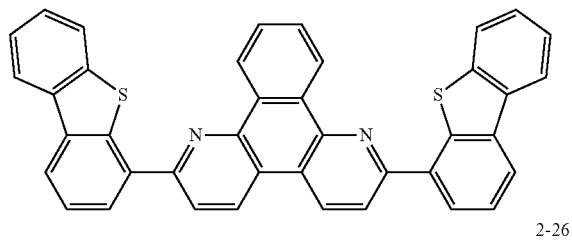

2-26
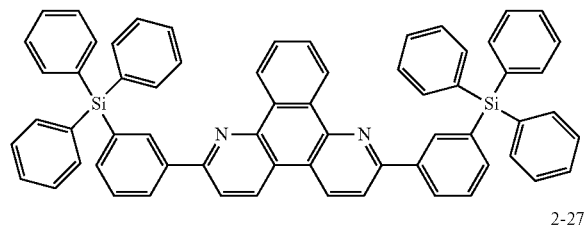

2-27
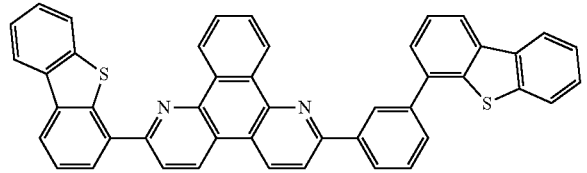

2-28
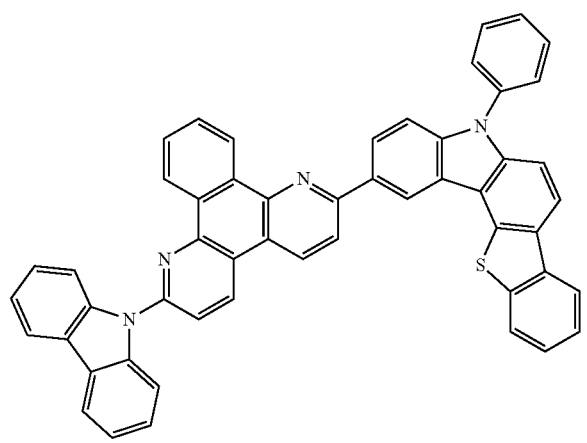

2-29
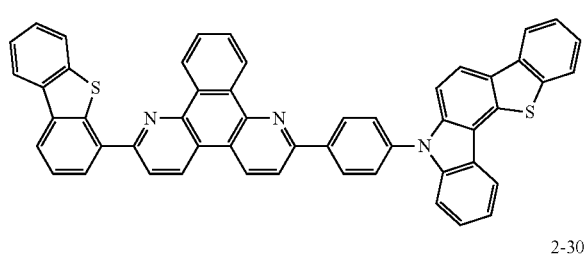

2-30
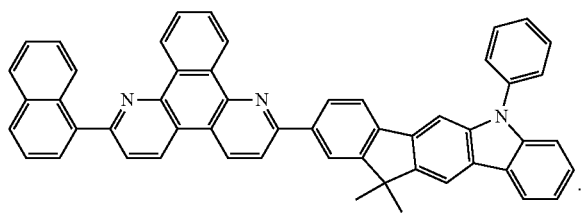

The emission layer may include, as a host material, the compounds represented by Chemical Formulae 1 and 2.

The emission layer may further include, as a dopant material, a phosphorescent material.

The compounds represented by Chemical Formulae 1 and 2 may be included in a weight of about 1:9 to about 9:1.

The emission layer may further include a dopant material, and the host material and the dopant material may be included in a weight of about 6:4 to about 9:1.

BRIEF DESCRIPTION OF THE DRAWING

Features will become apparent to those of skill in the art by describing in detail example embodiments with reference to the attached drawing in which:

FIG. 1 shows a structure of an organic light emitting diode device according to an example embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to one substituted with a substituent selected from a C1 to C30 alkyl group, a C6 to C36 aryl group, a C2 to C30 heteroaryl group, a C1 to C30 alkoxy group, a C2 to C30 alkenyl group, a C6 to C30 aryloxy group, a C3 to C40 silyloxy group, a C1 to C30 acyl group, a C2 to C30 acyloxy group, a C2 to C30 heteroaryloxy group, a C1 to C30 sulfonyl group, a C1 to C30 alkylthiol group, a C6 to C30 arylthiol group, a C1 to C30 heterocyclothiol group, a C1 to C30 phosphoric acid amide group, a C3 to C40 silyl group, NRR' (wherein, R and R' are independently substituents selected from hydrogen, a C1 to C30 alkyl group, and a C6 to C30 aryl group), a carboxyl group, a halogen, a cyano group, a nitro group, an azo group, a fluorene group, and a hydroxy group.

As used herein, when a definition is not otherwise provided, the term "hetero" refers to 1 to 3 heteroatoms selected from B, N, O, S, P, Si and P(=O) and remaining carbon in one ring.

Representative groups in the chemical formulae of the present invention are defined as follows (carbon numbers of substituents are not limited and do not limit characteristics of substituents).

The unsubstituted C1 to C30 (or C1 to C40) alkyl group may be linear and branched, and non-limiting examples thereof may be methyl, ethyl, propyl, isobutyl, sec-butyl, pentyl, iso-amyl, hexyl, heptyl, octyl, nonyl, dodecyl, and the like.

The unsubstituted C2 to C30 (or C2 to C40) alkenyl group may have at least one carbon double bond in the middle or terminal end of the unsubstituted alkyl group. Examples thereof may be ethenyl, propenyl, butenyl, and the like.

The unsubstituted C2 to C30 (or C2 to C40) alkynyl group may have at least one carbon triple bond in the middle or terminal end of the unsubstituted alkyl group. Examples thereof may be acetylene, propylene, phenylacetylene, naphthylacetylene, isopropylacetylene, t-butylacetylene, diphenylacetylene, and the like.

The unsubstituted C3 to C30 (or C3 to C40) cycloalkyl group may refer to cyclic alkyl group having 3 to 30 carbon numbers (or 3 to 40 carbon numbers).

The unsubstituted C1 to C30 (or C1 to C40) alkoxy group may refer to —OA (wherein, A is the above-described unsubstituted C1 to C30 (or C1 to C40) alkyl group, and non-limiting examples may be methoxy, ethoxy, propoxy, isopropyloxy, butoxy, pentoxy, and the like.

The unsubstituted C6 to C30 (or C6 to C40) aryl group may refer to a carbocycle aromatic system having at least one ring. The aryl group may have two or more rings, which may be fused or linked through a single bond and the like. The term aryl may include a aromatic system such as phenyl, naphthyl, anthracenyl, and the like.

The unsubstituted C6 to C30 (or C6 to C40) aryl group may be selected from a phenyl group, tolyl group, a biphenyl group, a naphthyl group, an anthracenyl group, a terphenyl group, a fluorenyl group, a phenanthrenyl group, a pyrenyl group, a diphenylanthracenyl group, a dinaphthylanthracenyl group, a pentacenyl group, a bromophenyl group, a hydroxyphenyl group, a stilbene group, an azobenzenyl group, and a ferroceny group.

The unsubstituted C2 to C30 (or C2 to C40) heteroaryl group may include 1, 2 or 3 heteroatoms selected from B, N, O, S, P, Si, and P(=O). The heteroaryl group may have two or more rings, which may be fused or linked through a single bond and the like. Examples of the unsubstituted C2 to C30 (or C2 to C40) heteroaryl group may be selected from a pyrazolyl group, an imidazolyl group, an oxazolyl group, a thiazolyl group, a triazinyl group, a triazolyl group, a tetrazolyl group, an oxadiazolyl group, a thiadiazolyl group, a pyridinyl group, a pyridazinyl group, a pyrimidinyl group, a carbazolyl group, a N-carbazolephenyl group, an indolyl group, a quinolinyl group, isoquinolinyl group, thiophene group, a dibenzothiophene group, a dibenzofuran group, and a benzimidazolyl group.

The unsubstituted C6 to C30 (or C6 to C40) aryloxy group may refer to —$OA_1$, wherein $A_1$ is the same functional group as the C6 to C30 (or C6 to C40) aryl group except carbon numbers. Examples of the aryloxy group may include a phenoxy group, and the like.

The unsubstituted C6 to C30 arylthiol group may refer to —$SA_1$, wherein $A_1$ is the same functional group as the C6 to C30 (or C6 to C40) aryl group except carbon numbers. Examples of the arylthiol group may include a benzenethiol group, a naphthylthiol group, and the like.

Hereinafter, an organic light emitting diode device according to an example embodiment is described.

FIG. 1 is a cross-sectional view of an organic light emitting diode device according to an embodiment.

Referring to FIG. 1, the organic light emitting diode device according to an example embodiment includes a lower electrode 1, an upper electrode 2 facing the lower electrode 1, an emission layer 5 interposed between the lower electrode 1 and the upper electrode 2, a lower auxiliary layer 3 interposed between the lower electrode 1 and the emission layer 5, and an upper auxiliary layer 4 interposed between the upper electrode 2 and the emission layer 5.

A substrate (not shown) may be disposed on the side of the lower electrode 1 (e.g., anode) or on the side of the upper electrode 2 (e.g., cathode). The substrate may be made of an inorganic material such as glass, or an organic material such as polycarbonate, polymethylmethacrylate, polyethyleneterephthalate, polyethylenenaphthalate, polyamide, polyethersulfone, or a combination thereof, a silicon wafer, and the like.

One of the lower electrode 1 and the upper electrode 2 may be an anode, and the other one may be a cathode. For example, the lower electrode 1 may be an anode, and the upper electrode 2 may be a cathode, or vice versa.

One of the lower electrode 1 and upper electrode 2 may be a transparent electrode, and the transparent electrode may be formed of, for example, conductive oxide such as indium tin oxide (ITO), indium zinc oxide (IZO), tin oxide ($SnO_2$), zinc oxide (ZnO), or a combination thereof, or a metal such as Al, Ag, or Mg in a thin thickness.

In an example embodiment, the emission layer 5 may include a compound represented by the following Chemical Formula 1 and a compound represented by the following Chemical Formula 2.

[Chemical Formula 1]

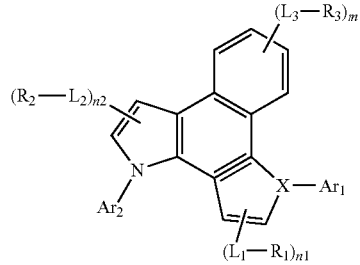

In Chemical Formula 1 according to the present example embodiment, each X is independently oxygen (O), sulfur (S), or nitrogen (N), $L_1$ to $L_3$ are independently a single bond, a substituted or unsubstituted C6 to C30 arylene group, or a substituted or unsubstituted C2 to C30 heteroarylene group, $R_1$ to $R_3$ are independently hydrogen, a substituted or unsubstituted C1 to C30 alkyl group, a substituted or unsubstituted C1 to C30 haloalkyl group, a halogen, a cyano group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 alkoxy group, a substituted or unsubstituted C6 to C30 aryloxy group, a substituted or unsubstituted C2 to C30 heteroaryl group, a substituted or unsubstituted C6 to C30 arylthiol group, a substituted or unsubstituted amino group, a substituted or unsubstituted silyl group, a nitro group, or a hydroxy group, $Ar_1$ and $Ar_2$ are independently a substituted or unsubstituted C1 to C30 alkyl group, a substituted or unsubstituted C1 to C30 haloalkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C1 to C30 alkoxy group, a substituted or unsubstituted C6 to C30 aryloxy group, a substituted or unsubstituted C2 to C30 heteroaryl group, a substituted or unsubstituted C6 to C30 arylthiol group, a substituted or unsubstituted amino group, or a substituted or unsubstituted silyl group, and n1, n2, and m indicate ring substitutions. n1 and n2 are independently integers ranging from 0 to 2, and m is an integer ranging from 0 to 4.

[Chemical Formula 2]

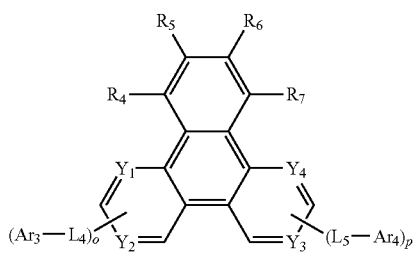

In Chemical Formula 2 according to the present example embodiment, $R_4$ to $R_7$ are independently hydrogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C40 aryl group, a substituted or unsubstituted C2 to C40 heteroaryl group, a substituted or unsubstituted C6 to C40 aryloxy group, a substituted or unsubstituted C1 to C40 alkoxy group, a substituted or unsubstituted C6 to C40 arylamino group, a substituted or unsubstituted C3 to C40 cycloalkyl group, or a substituted or unsubstituted C2 to C40 heterocycloalkyl group, $Y_1$ to $Y_4$ are independently nitrogen (N), or $CR_8$, where $R_8$ is hydrogen, a C1 to C40 alkyl group, a C6 to C40 aryl group, or a C2 to C40 heteroaryl group, $L_4$ and $L_5$ are independently a single bond, a substituted or unsubstituted C6 to C30 arylene group, or a substituted or unsubstituted C2 to C30 heteroarylene group, $Ar_3$ and $Ar_4$ are independently a substituted or unsubstituted C6 to C40 aryl group, a substituted or unsubstituted C2 to C40 heteroaryl group, or a substituted or unsubstituted silyl group, and o and p indicate ring substitutions. o and p are independently integers ranging from 0 to 3, provided that o and p are not simultaneously 0.

In an example embodiment, in Chemical Formula 1, each X may independently be sulfur (S) or nitrogen (N), $L_1$ to $L_3$ may be independently a single bond, a substituted or unsubstituted C6 to C30 arylene group, or a substituted or unsubstituted C2 to C30 heteroarylene group, $R_1$ to $R_3$ may be independently a substituted or unsubstituted C6 to C30 aryl group, a substituted or unsubstituted C2 to C30 heteroaryl group, or a substituted or unsubstituted silyl group, and $Ar_1$ and $Ar_2$ may be a substituted or unsubstituted C6 to C30 aryl group, or a substituted or unsubstituted C2 to C30 heteroaryl group.

In an example embodiment, in Chemical Formula 2,

All $R_4$ to $R_7$ may be hydrogen;

$Y_1$ to $Y_4$ may be independently nitrogen (N), or $CR_8$, where $R_8$ is hydrogen, a C1 to C40 alkyl group, a C6 to C40 aryl group, or a C2 to C40 heteroaryl group, $L_4$ and $L_5$ may be independently a single bond, a substituted or unsubstituted C6 to C30 arylene group, or a substituted or unsubstituted C2 to C30 heteroarylene group, o may be 0 or 1, and p may be 1; and $Ar_3$ and $Ar_4$ may be independently a substituted or unsubstituted C6 to C40 aryl group, a substituted or unsubstituted C2 to C40 heteroaryl group, or a substituted or unsubstituted silyl group.

The compound represented by the above Chemical Formula 1 may be at least one of the compounds of the following Group 1, but is not limited thereto.

[Group 1]

1-1

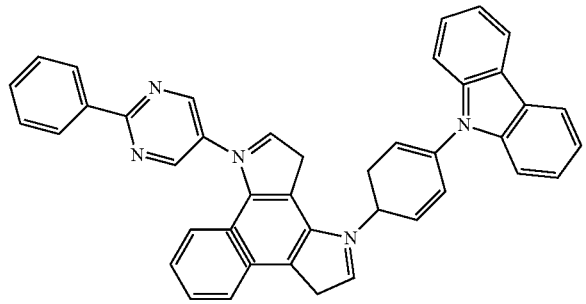

1-2

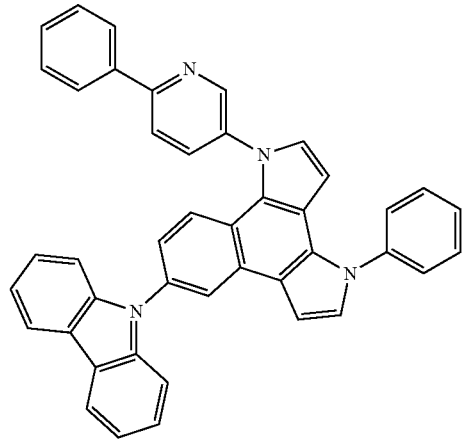

1-3

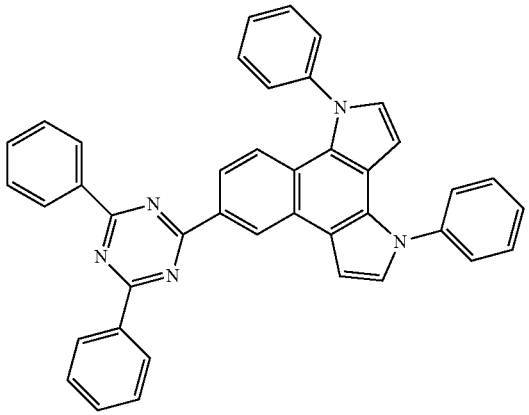

-continued
1-4
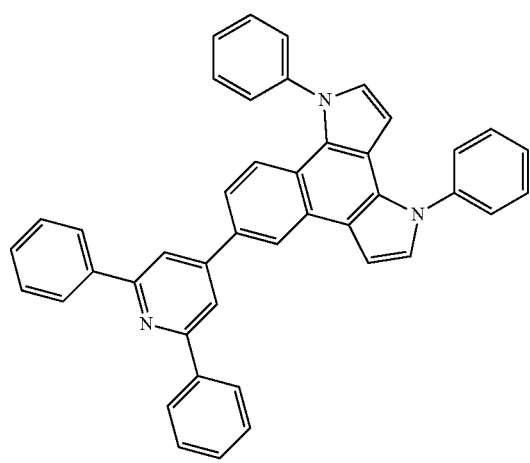
1-5
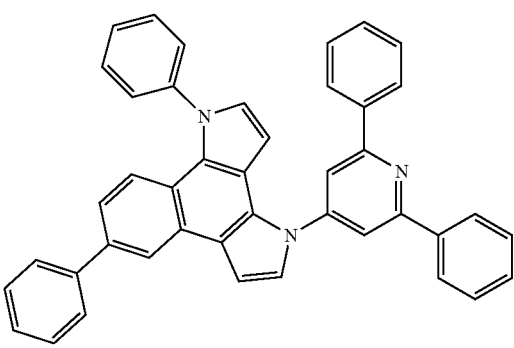
1-6
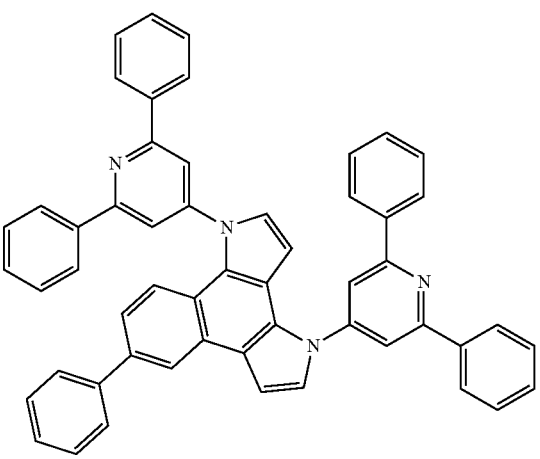
-continued
1-7
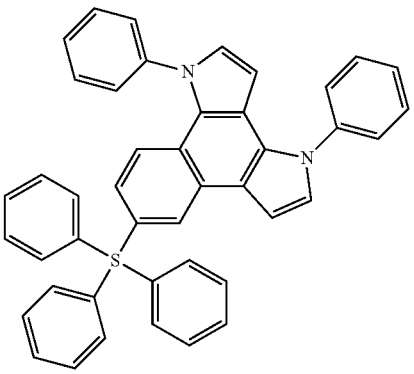
1-8
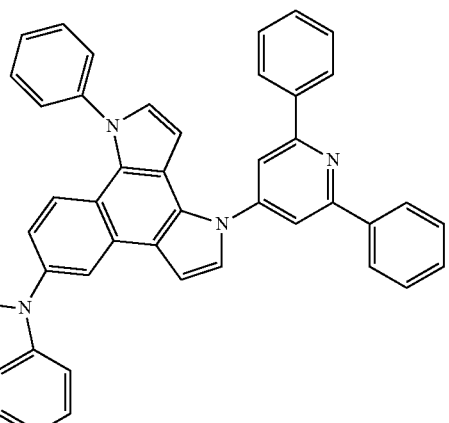
1-9
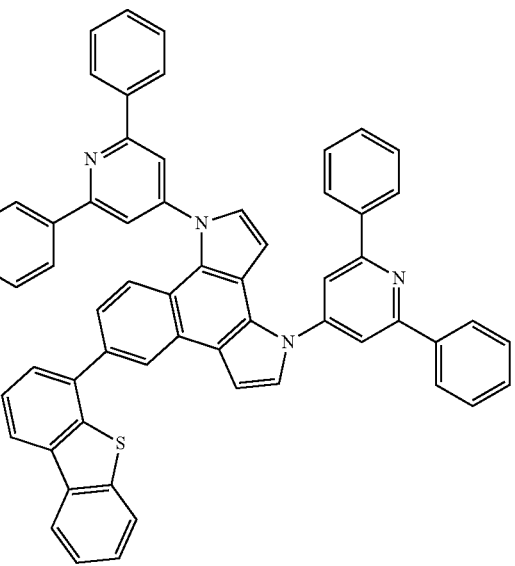

-continued
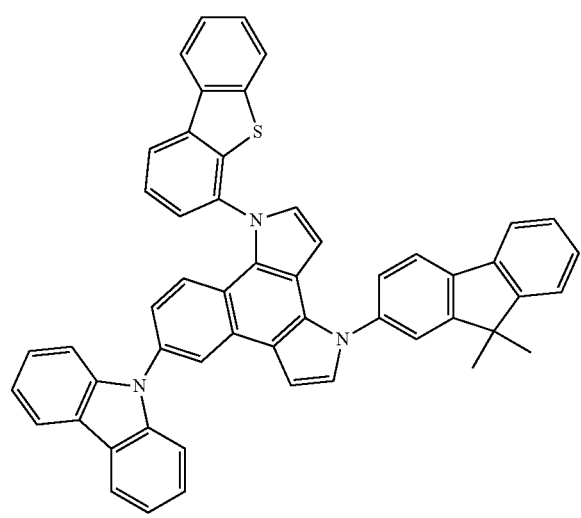
1-10
1-11
1-12
-continued
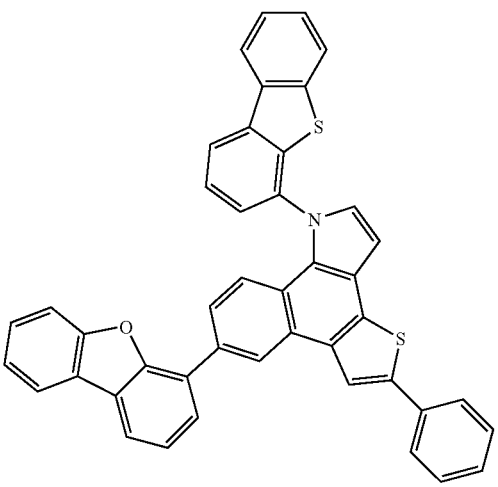
1-13
1-14
1-15
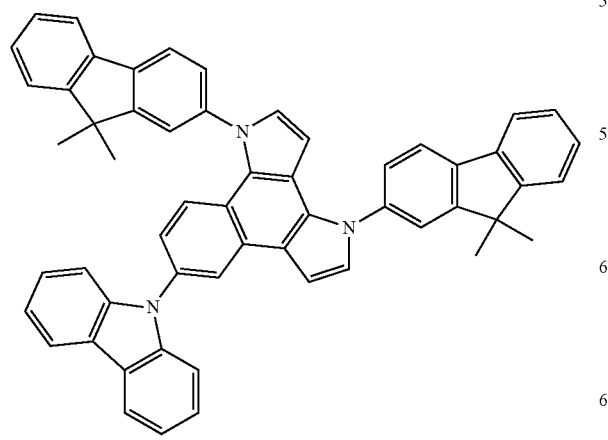

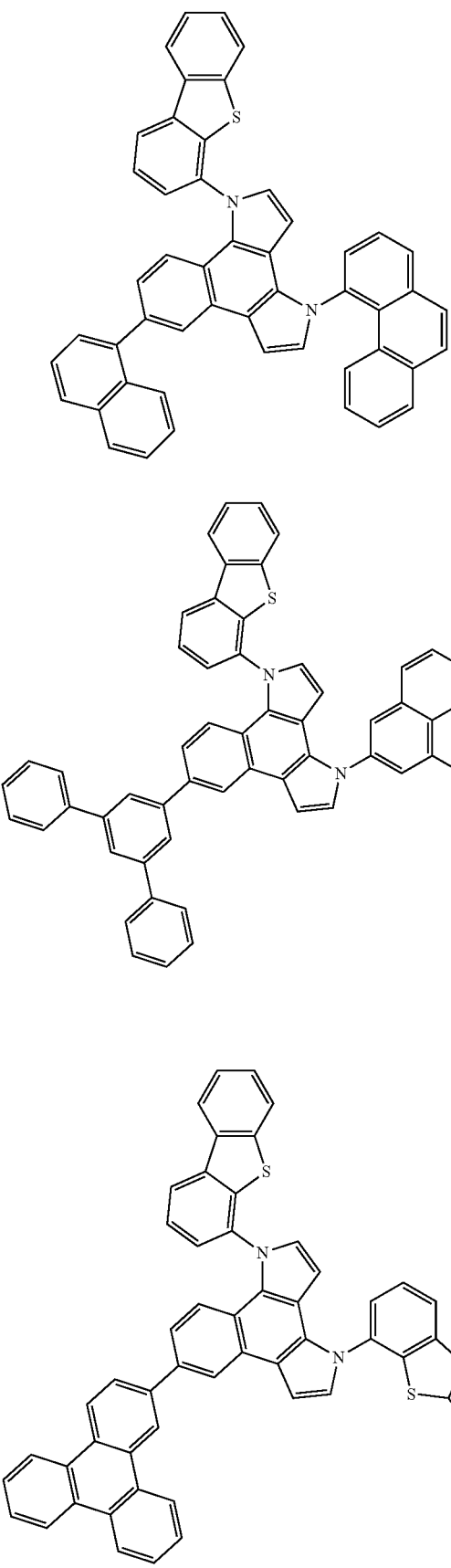
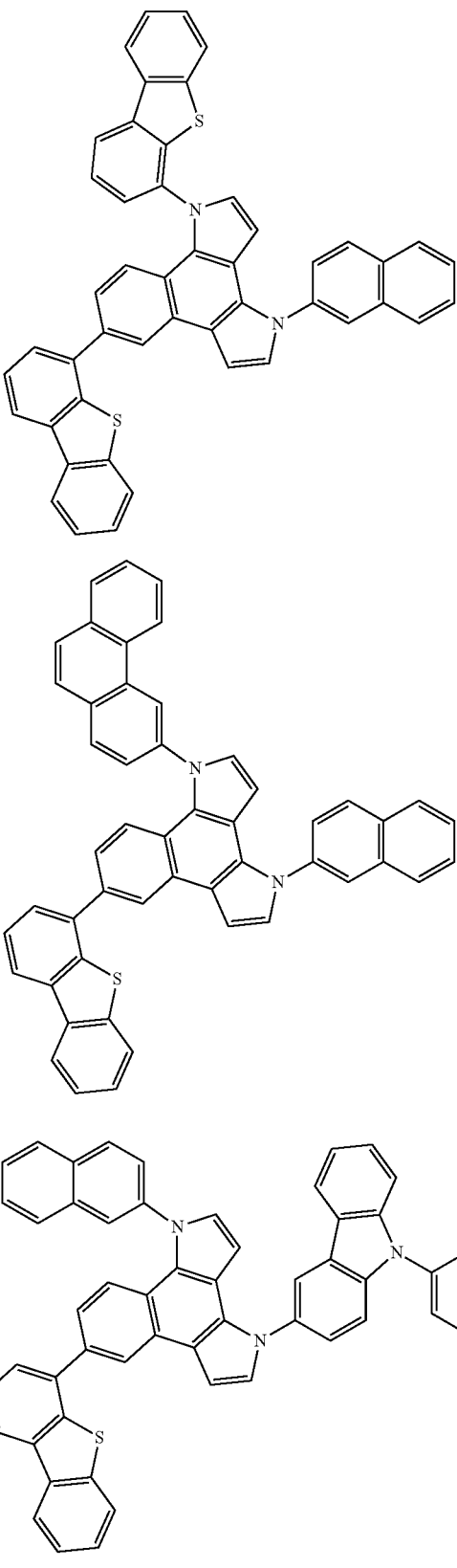
The compound represented by the above Chemical Formula 2 may be at least one of the compounds of the following Group 2, but is not limited thereto.

[Group 2]
2-1
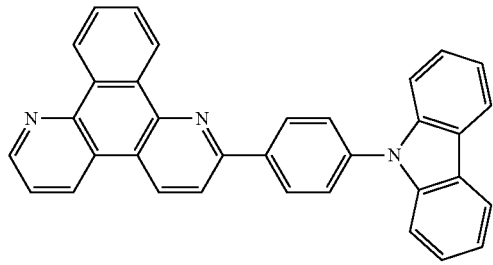
2-2
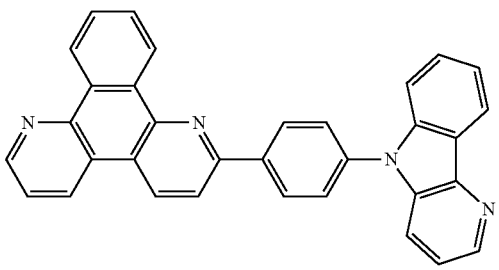
2-3
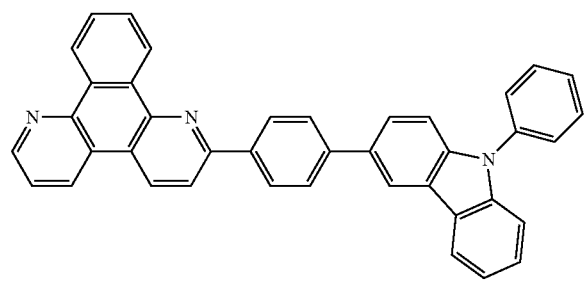
2-4
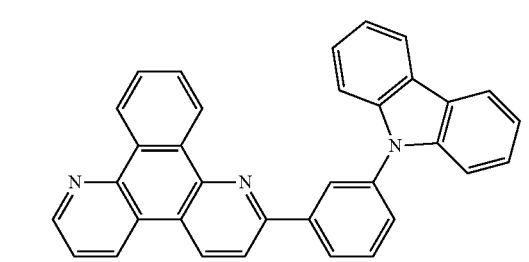
2-5
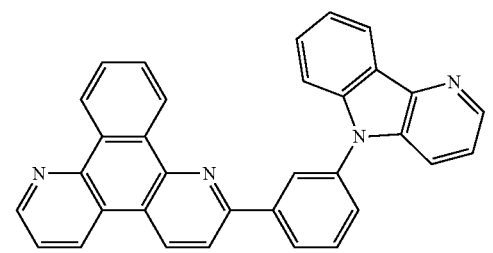
2-6
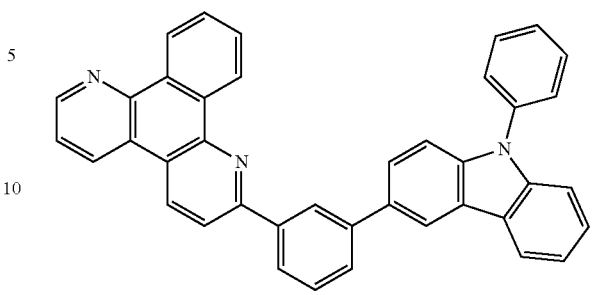
2-7
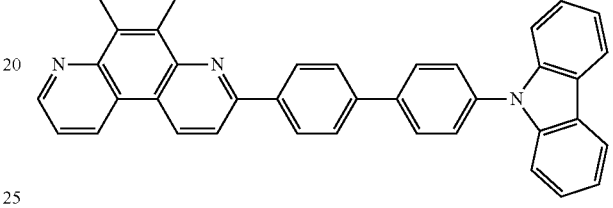
2-8
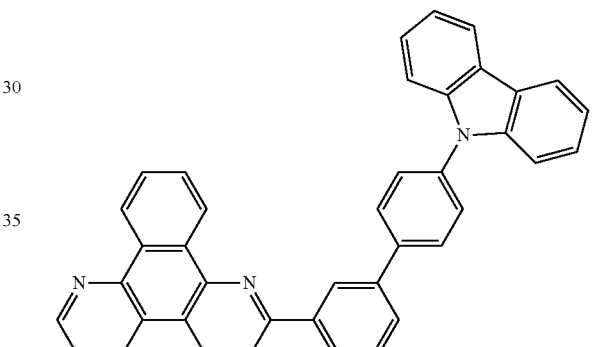
2-9
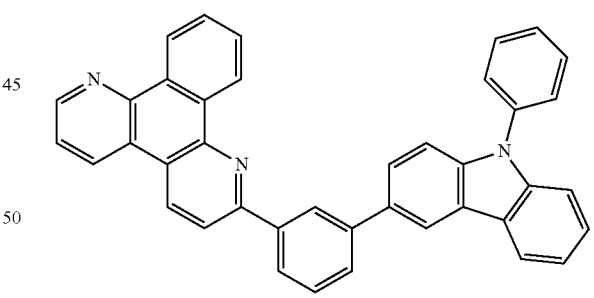
2-10
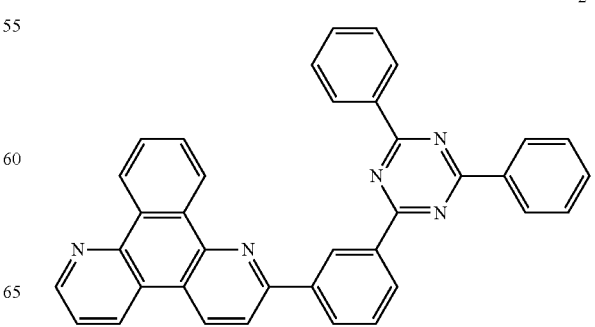

-continued
2-11
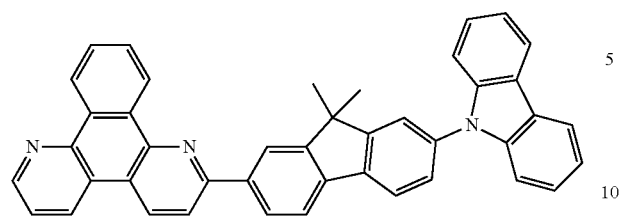
2-12
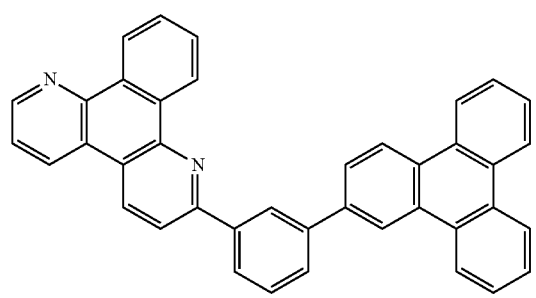
2-13
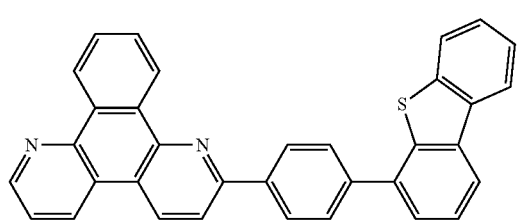
2-14
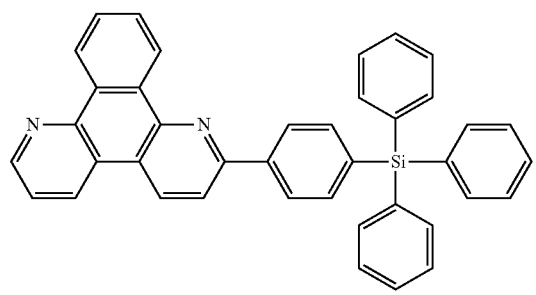
2-15
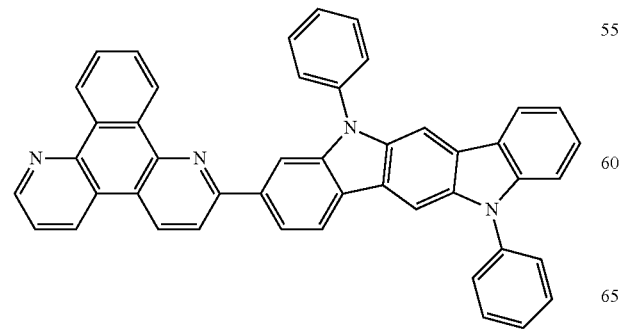
-continued
2-16
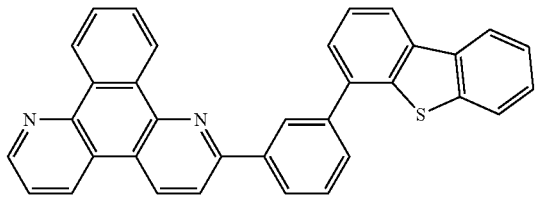
2-16
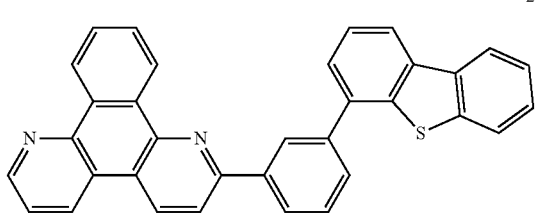
2-17
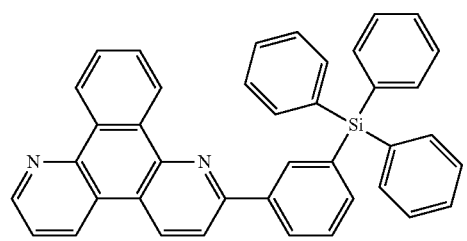
2-18
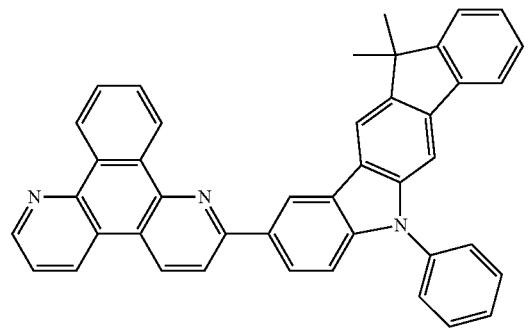
2-19
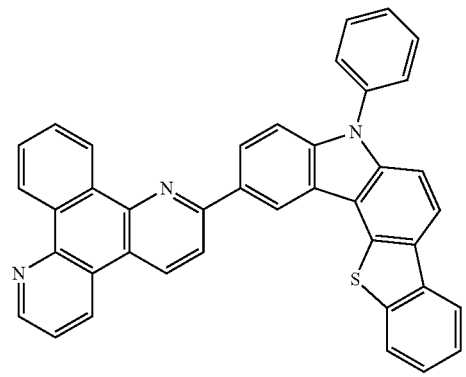

2-20
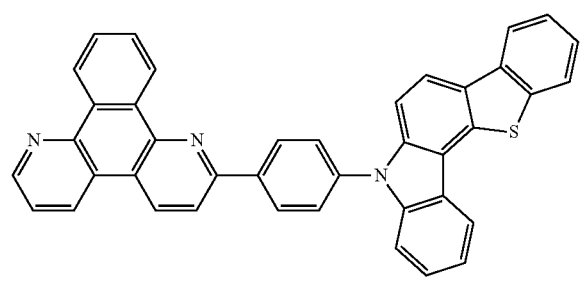
2-21
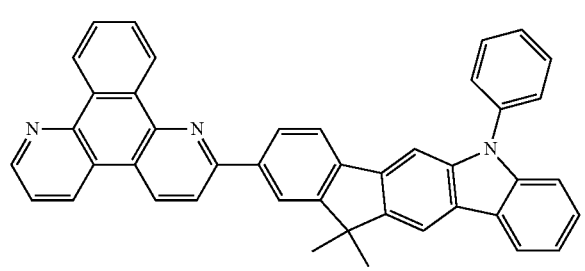
2-22
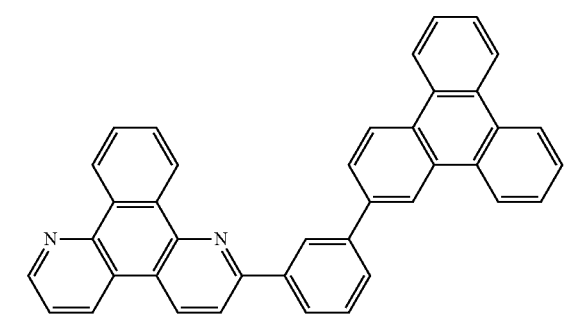
2-23
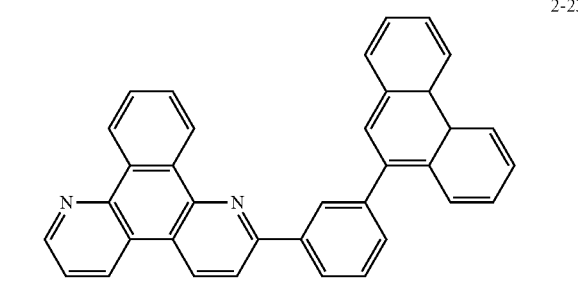
2-24
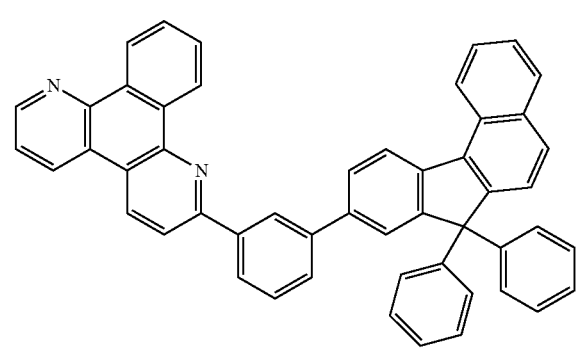
2-25
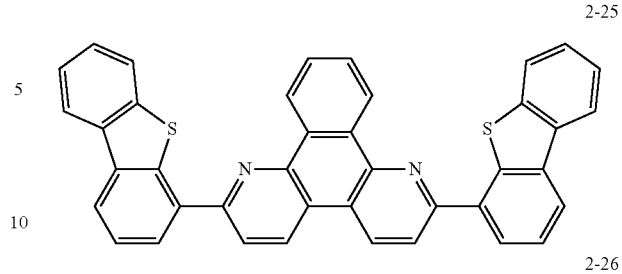
2-26
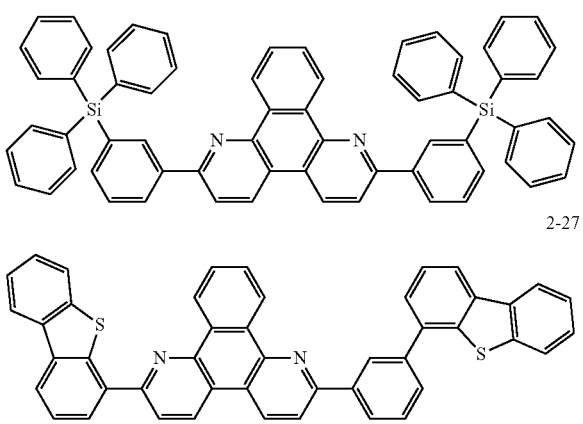
2-27
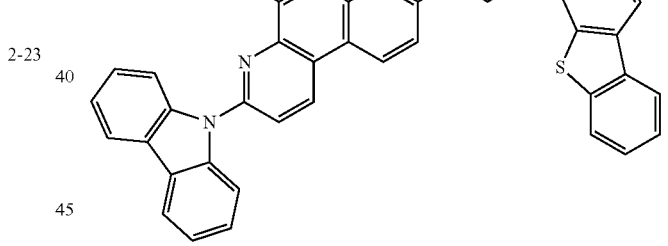
2-28
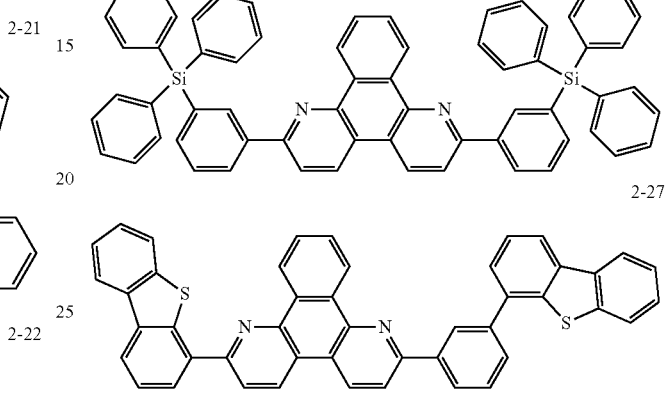
2-29
2-30
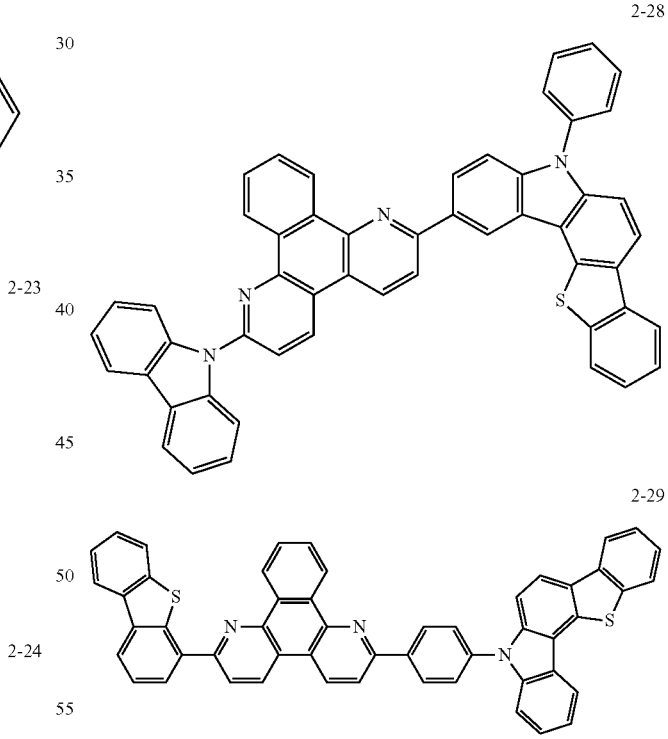

When the compounds represented by Chemical Formulae 1 and 2 are included in the emission layer at a weight ratio of about 1:9 to about 9:1, the balance of hole mobility and electron mobility may be enhanced to improve the electrochemical stability, and thus the life-span and efficiency characteristics of an organic light emitting diode device including the emission layer may be simultaneously improved. In an implementation, the compounds represented by Chemical Formulae 1 and 2 may be included in the emission layer at a weight ratio of about 2:7 to about 7:2, respectively.

In the case of an organic light emitting diode device, generally, the life-span may be shortened if the luminous efficiency is improved; or the luminous efficiency is deteriorated if the life-span is prolonged, so the luminous efficiency and the life-span have a trade-off relationship. However, when the compound represented by Chemical Formula 1 and the compound represented by Chemical Formula 2 are included in the emission layer at a weight ratio of about 1:9 to about 9:1, e.g., about 2:7 to 7:2, respectively, the balance of hole mobility and electron mobility may be enhanced to improve the electrochemical stability, thus the luminous efficiency and the life-span may be simultaneously satisfactory.

The emission layer may include the compound represented by Chemical Formula 1 and the compound represented by Chemical Formula 2 as a host material. In this case, a dopant material may be further included, and the dopant material may be, for example, a phosphorescent dopant material. When the emission layer further includes the dopant material, the electrochemical stability of organic light emitting diode device may be improved, and the luminous efficiency may be increased to decrease the current density of organic light emitting diode device, and the load may be reduced during driving the device to increase the life-span.

A red dopant may include PtOEP, Ir(piq)$_3$, Btp$_2$Ir(acac), DCJTB or the like, but is not limited thereto.

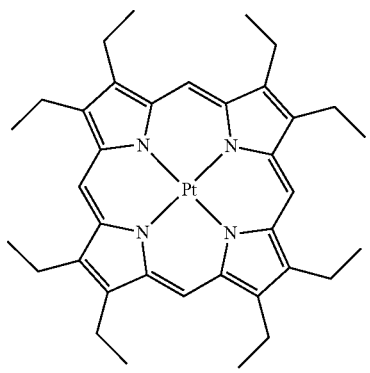

PtOEP

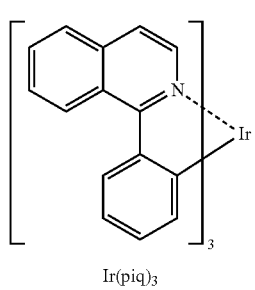

Ir(piq)$_3$

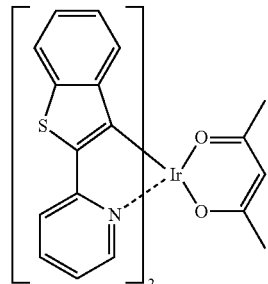

Btp$_2$Ir(acac)

A green dopant may include Ir(ppy)$_3$ (ppy=phenylpyridine), Ir(ppy)$_2$(acac), Ir(mpyp)$_3$, C545T or the like, but is not limited thereto.

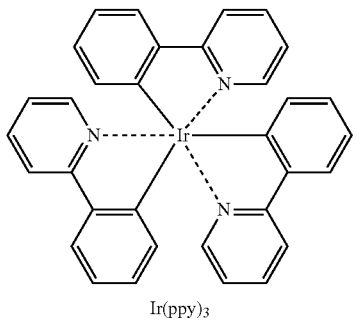

Ir(ppy)$_3$

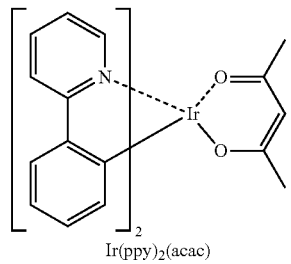

Ir(ppy)$_2$(acac)

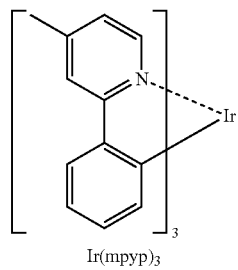

Ir(mpyp)$_3$

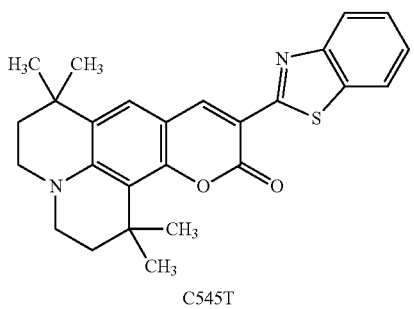

C545T

A blue dopant may include F$_2$Irpic, (F$_2$ppy)$_2$Ir(tmd), Ir(d-fppz)$_3$, ter-fluorene, 4,4'-bis(4-diphenylaminostyryl)biphenyl (DPAVBi), 2,5,8,11-tetra-ter-butyl perylene (TBP) or the like, but is not limited thereto.

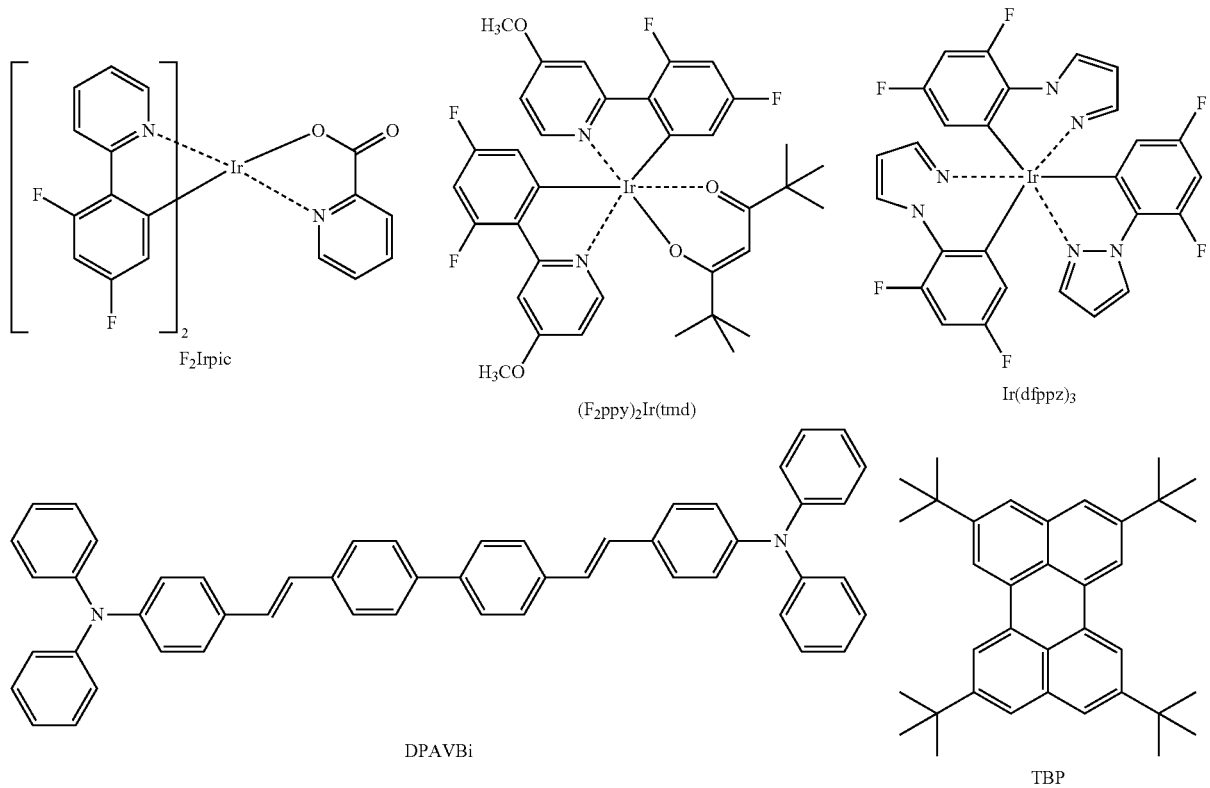

F₂Irpic (F₂ppy)₂Ir(tmd)

Ir(dfppz)₃

DPAVBi

TBP

The host material may be included in a higher amount than the amount of the dopant material. For example, the host material and the dopant material may be included at a weight ratio of about 6:4 to about 9:1.

One of the lower auxiliary layer 3 and the upper auxiliary layer 4 may be a hole auxiliary layer, and the other one may be an electron auxiliary layer. At least one of the lower auxiliary layer 3 and the upper auxiliary layer 4 may be omitted if required.

The hole auxiliary layer may include at least one layer selected from, for example, a hole transport layer (HTL), a hole injection layer (HIL), and an electron blocking layer.

A hole injection layer (HIL) may be formed on the lower electrode according to the various methods such as vacuum deposition, spin coating, casting, and LB.

When the hole injection layer (HIL) is formed by the vacuum deposition, the deposition conditions may be different according to the compound used as the material for a hole injection layer (HIL), the structure of the objective hole injection layer (HIL), and the thermal characteristics, but generally, may be appropriately selected within the ranges of deposit temperature of about 100 to about 500° C., the vacuum degree of about $10^{-8}$ to about $10^{-3}$ torr, the deposition rate of about 0.01 to about 100 Å/sec.

When the hole injection layer (HIL) is formed by the spin coating, the coating conditions are different according to the compound used as a material for the hole injection layer (HIL), the structure of the objective hole injection layer (HIL), and the thermal characteristics or the like, but may be suitably selected from the ranges of a coating speed of about 2000 rpm to about 5000 rpm, a heat treatment temperature of about 80° C. to about 200° C. for removing the solvent after coating.

The hole injection layer (HIL) may include a general hole injection material, for example, a phthalocyanine compound such as copper-phthalocyanine, and the like, m-MTDATA [4,4',4''-tris (3-methylphenylphenylamino)triphenylamine], NPB (N,N'-di(1-naphthyl)-N,N'-diphenylbenzidine, TDATA, 2T-NATA, Pani/DBSA (polyaniline/dodecylbenzenesulfonic acid), PEDOT/PSS (poly(3,4-ethylenedioxythiophene)/poly(4-styrenesulfonate)), pani/CSA (polyaniline/camphor sulfonic acid) or PANI/PSS (polyaniline)/poly (4-styrenesulfonate)), and the like, but is not limited thereto.

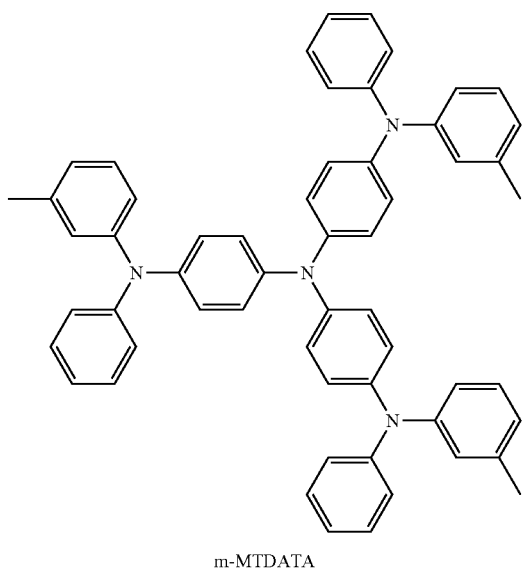

m-MTDATA

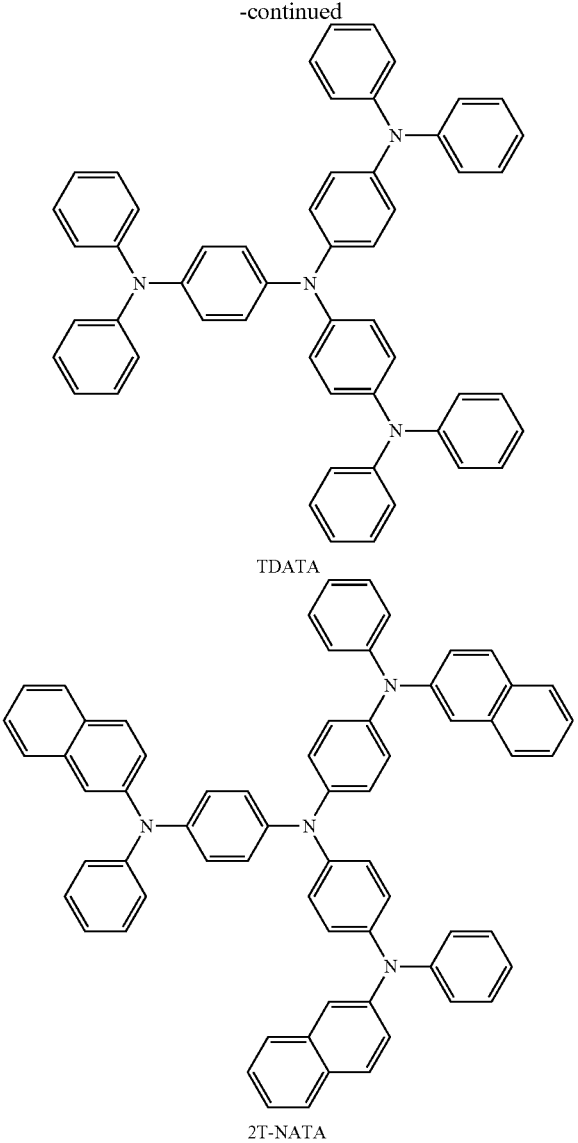

TDATA

2T-NATA

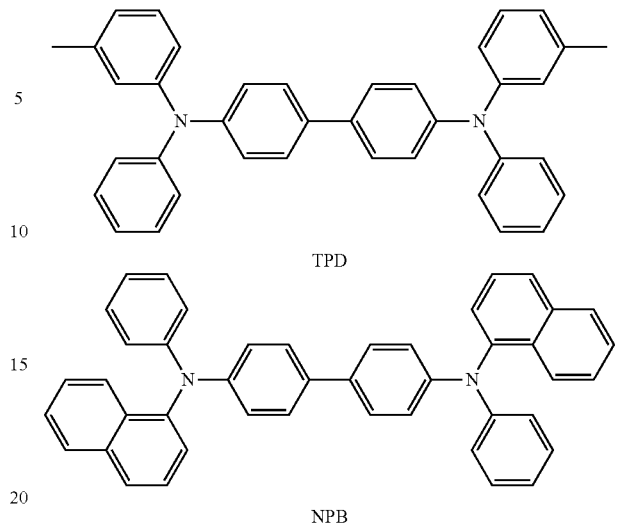

TPD

NPB

The hole transport layer (HTL) may have a thickness of about 50 Å to 1000 Å, e.g., about 100 Å to 600 Å. When the hole transport layer (HTL) has the thickness within the range same as in above, the excellent hole transport characteristics may be obtained without substantially increasing the driving voltage.

The hole injection layer (HIL) or the hole transport layer (HTL) may further include an auxiliary material in order to improve the conductivity of layer.

The auxiliary material may be, for example, p-dopant. Non-limiting examples of the p-dopant may include a quinone derivative such as tetracyanoquinone dimethane (TCNQ) and 2,3,5,6-tetrafluoro-tetracyano-1,4-benzoquinonedimethane (F4TCNQ); a metal oxide such as tungsten oxide and molybdenum oxide; and a cyano group-contained compound such as the following compound 100 or the like, but is not limited thereto.

[Compound 100]

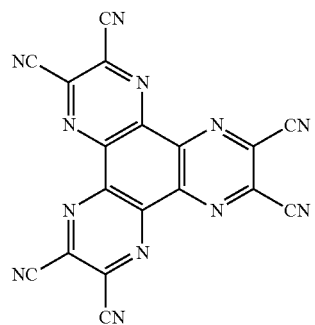

The hole injection layer (HIL) may have a thickness of about 100 Å to about 10000 Å, e.g., about 100 Å to about 1000 Å. When the hole injection layer (HIL) has the thickness within the range, the excellent hole injection characteristics may be accomplished without increasing the driving voltage.

Then a hole transport layer (HTL) may be formed on the hole injection layer (HIL) according to the various methods such as a vacuum deposition, a spin coating, a casting, LB, etc. When the hole transport layer (HTL) is formed by the vacuum deposition and the spin coating, the deposition conditions and the coating conditions are different according to the used compound, but may be generally selected from the condition ranges generally the same as in forming the hole injection layer (HIL).

The hole transport layer (HTL) may include a general hole transport layer (HTL) material, for example, a carbazole derivative such as N-phenylcarbazole, polyvinylcarbazole, and the like, an amine derivative having an aromatic condensed ring such as NPB, N,N'-bis(3-methylphenyl)-N,N-diphenyl-[1,1-biphenyl]-4,4'-diamine (TPD), and the like. For example, in the case of TCTA, it may prevent the diffusion of exciton from the emission layer as well as it may transport a hole.

When the hole injection layer (HIL) or the hole transport layer (HTL) further include the auxiliary material, the auxiliary material may be variously modified such as uniformly dispersed in the layers or randomly distributed in the layers.

The electron auxiliary layer may include at least one layer selected from an electron transport layer (ETL), an electron injection layer (EIL), and a hole blocking layer.

When the emission layer includes a phosphorescent dopant, a hole blocking layer may be formed on the emission layer to prevent the phenomenon that triplet exciton or hole diffuses into the electron transport layer (ETL). The selected hole blocking layer material is not particularly limited, and may be selected from the known hole blocking layer materials. For example, oxadiazole derivative or triazole derivative, phenanthroline derivative, Balq, BCP or the like may be used.

The hole blocking layer may have a thickness of about 50 Å to about 1000 Å, e.g., of about 100 Å to about 300 Å. When the hole blocking layer has the thickness less than about 50 Å, the hole blocking characteristics may be deteriorated; when the hole blocking layer has the thickness greater than about 1000 Å, the driving voltage may be increased.

The electron transport layer (ETL) may be formed by the various methods such as a vacuum deposition, or spin coating, casting or the like. When the electron transport layer (ETL) is formed by the vacuum deposition and the spin coating, the condition is different according to the used compound, but generally selected from the same condition ranges as in forming the hole injection layer (HIL).

The electron transport layer (ETL) material may be an organic compound represented by Chemical Formula 1 as in above. In another implementation, the material may be selected from any materials for an electron transport layer (ETL). For example, the known materials such as quinoline derivative, particularly, tris(8-quinolinolate)aluminum ($Alq_3$), TAZ, Balq, etc., may be used, but is not limited thereto.

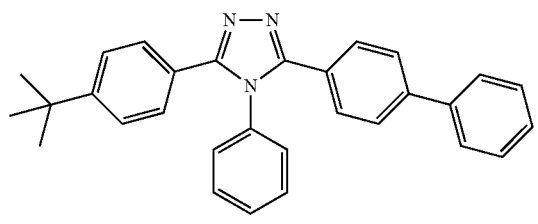

TAZ

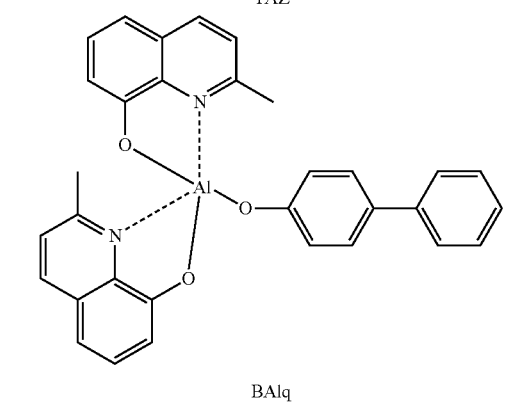

BAlq

The electron transport layer (ETL) may have a thickness of about 100 Å to about 1000 Å, e.g., of about 100 Å to about 500 Å. When the electron transport layer (ETL) has the thickness within the range, the excellent electron transport characteristics may be obtained without substantially increasing the driving voltage.

The electron transport layer (ETL) of organic light emitting diode device according to another embodiment may include an electron transport organic compound and a metal-containing material. Non-limiting examples of the electron transport organic compound may include DNA (9,10-di(naphthalene-2-yl)anthracene); and the anthracene-based compound such as the following compounds 101 and 102, and the like, but is not limited thereto.

[Compound 101]

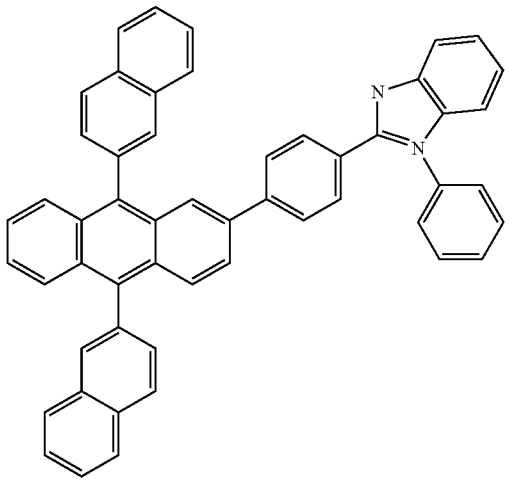

[Compound 102]

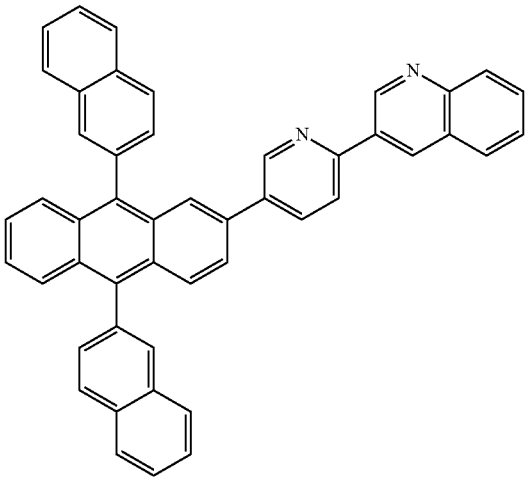

The metal-containing material may include a Li complex. Non-limiting examples of Li complex may include lithium quinolate (LiQ) or the following compound 103 or the like, but is not limited thereto.

[Compound 103]

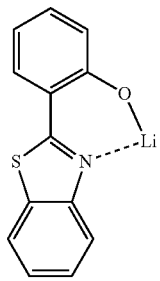

In addition, an electron injection layer (EIL) may be stacked on the electron transport layer (ETL) as a material having functions of easily injecting electrons from the cathode.

The electron injection layer (EIL) may include any general material for forming an electron injection layer (EIL) such as LiF, NaCl, CsF, $Li_2O$, BaO or the like. The deposition conditions and the coating conditions are different according to the used compound but may be selected from the condition ranges generally the same as in generally forming the hole injection layer (HIL).

The electron injection layer (EIL) may have a thickness of about 1 Å to about 100 Å, e.g., of about 5 Å to about 90 Å. When the electron injection layer (EIL) has the thickness within the range, the excellent electron inject characteristics may be obtained without substantially increasing the driving voltage.

The lower auxiliary layer 3, the upper auxiliary layer 4, and the emission layer 5 may be formed by, for example, a vacuum deposition, a spin coating, a casting, LB or the like, but is not limited thereto.

For example, the organic light emitting diode device according to the embodiment may have an anode/hole injection layer (HIL)/emission layer/cathode, anode/hole injection layer (HIL)/hole transport layer (HTL)/emission layer/electron transport layer (ETL)/cathode, or anode/hole injection layer (HIL)/hole transport layer (HTL)/emission layer/electron transport layer (ETL)/electron injection layer (EIL)/cathode structure. In addition, the organic light emitting diode device may have a structure of anode/functional layer simultaneously having hole injection function and hole transport function/emission layer/electron transport layer (ETL)/cathode or anode/functional layer simultaneously having a hole injection function and a hole transport function/emission layer/electron transport layer (ETL)/electron injection layer (EIL)/cathode. In another implementation, the organic light emitting diode device may have a structure of anode/hole transport layer (HTL)/emission layer/functional layer simultaneously having electron injection function and electron transport function/cathode, anode/hole injection layer (HIL)/emission layer/functional layer simultaneously having electron injection function and electron transport function/cathode, or anode/hole injection layer (HIL)/hole transport layer (HTL)/emission layer/functional layer simultaneously having electron injection function and electron transport function/cathode structure, but is not limited thereto.

The organic light emitting diode device according to an embodiment may be applied to the various structures like a front light emitting, a bottom light emitting, and dual type light emitting or the like.

The organic light emitting diode device according to an embodiment may be mounted in the various shaped flat panel displays, for example, a passive matrix organic light emitting diode (OLED) display and an active matrix organic light emitting diode (OLED) display. When applied to the active matrix organic light emitting diode (OLED) display, the lower electrode 1 may be electrically connected to a thin film transistor as a pixel electrode. In addition, the first layer of organic light emitting diode device according to an embodiment may be formed by the deposition using the organic compound according to an embodiment or may be also formed by the wet method of coating the organic compound solution according to an embodiment.

Hereinafter, specific synthesis examples and examples illustrate example embodiments in more detail. These examples, however, should not in any sense be interpreted as limiting the scope of the embodiments.

EXAMPLES

Example 1

15 Ω/cm² (500 Å) ITO glass substrate (manufactured by Corning) was cut in a size of 50 mm×50 mm×0.5 mm and cleaned with ultrasonic wave using isopropyl alcohol and pure water for each 10 minutes, and then irradiated with ultraviolet (UV) for about 10 minutes and cleaned by exposing to ozone.

N-(naphthalene-2-yl)-N,N-bis(4-(naphthalene-2-yl(phenyl)amino)phenyl)-N-phenylbenzene-1,4-diamine (hereinafter, 2-TNATA) represented by the following Chemical Formula A was vacuum deposited on the ITO glass substrate to provide a hole injection layer (HIL) having a thickness of 600 Å and then was vacuum deposited with 4,4'-bis[N-(1-naphthyl)-N-phenylamino]biphenyl (hereinafter, NPB) represented by the following Chemical Formula B in a thickness of 300 Å to provide a hole transport layer (HTL).

A red phosphorescent dopant of bis-(1-phenylisoquinolyl) iridium(III)acetylacetonate, (piq)₂Ir(acac) (hereinafter, D1), the compound 1-1 (manufactured by Samsung Display), and the compound 2-1 (manufactured by Samsung Display) were simultaneously deposited at a weight ratio of 10:70:20 on the hole transport layer (HTL) to provide an emission layer in a thickness of 300 Å. Then an electron transport layer (ETL) of Alq₃ was deposited on the emission layer in a thickness of 300 Å and vacuum deposited with Al in a thickness of 1200 Å (cathode) to provide an Al electrode, thus to provide an organic light emitting diode device.

[Chemical Formula A]

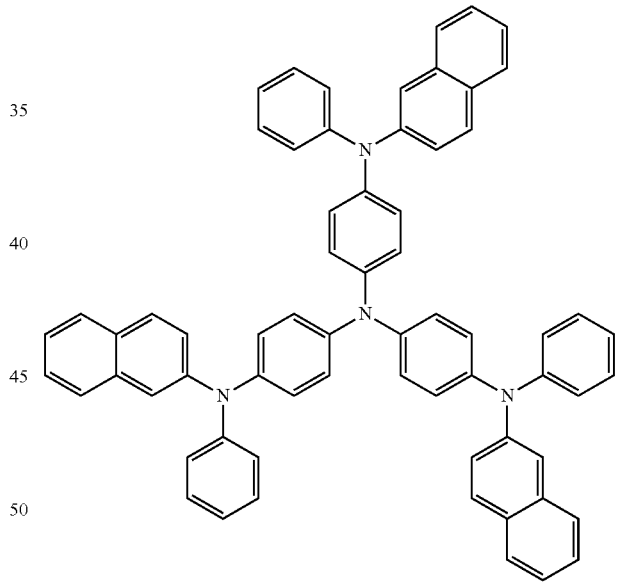

[Chemical Formula B]

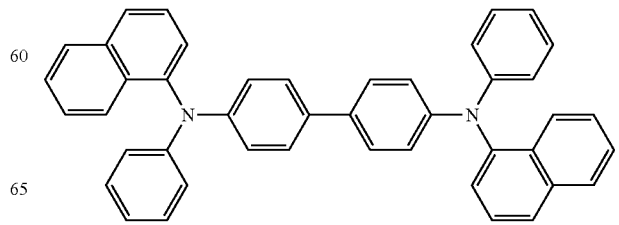

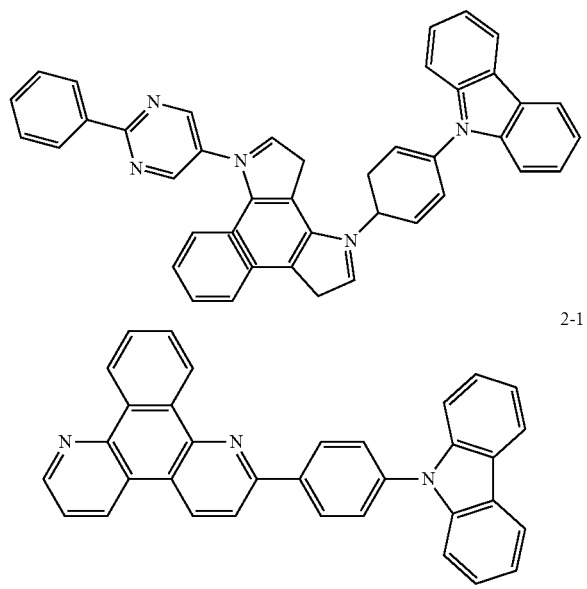

1-1

2-1

Example 2

An organic light emitting diode device was manufactured in accordance with the same procedure as in Example 1, except using the D1, the compound 1-1, and the compound 2-1 at a weight ratio of 10:45:45 instead of 10:70:20 for forming the emission layer.

Example 3

An organic light emitting diode device was manufactured in accordance with the same procedure as in Example 1, except using the D1, the compound 1-1, and the compound 2-1 at a weight ratio of 10:20:70 instead of 10:70:20 for forming the emission layer.

Example 4

An organic light emitting diode device was manufactured in accordance with the same procedure as in Example 2, except using the compound 1-3 (manufactured by Samsung Display) instead of the compound 1-1 for forming the emission layer.

1-3

Example 5

An organic light emitting diode device was manufactured in accordance with the same procedure as in Example 2, except using the compound 1-5 (manufactured by Samsung Display) instead of the compound 1-1, and using the compound 2-8 (manufactured by Samsung Display) instead of the compound 2-1 for forming the emission layer.

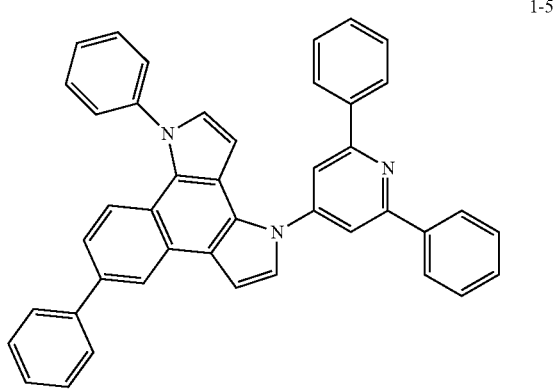

1-5

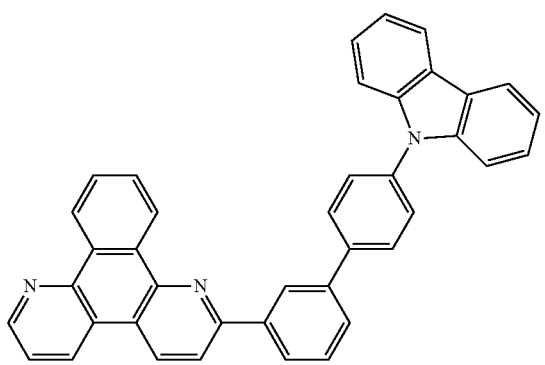

2-8

Example 6

An organic light emitting diode device was manufactured in accordance with the same procedure as in Example 2, except using the compound 1-6 (manufactured by Samsung Display) instead of the compound 1-1, and using the compound 2-12 (manufactured by Samsung Display) instead of the compound 2-1 for forming the emission layer.

1-6

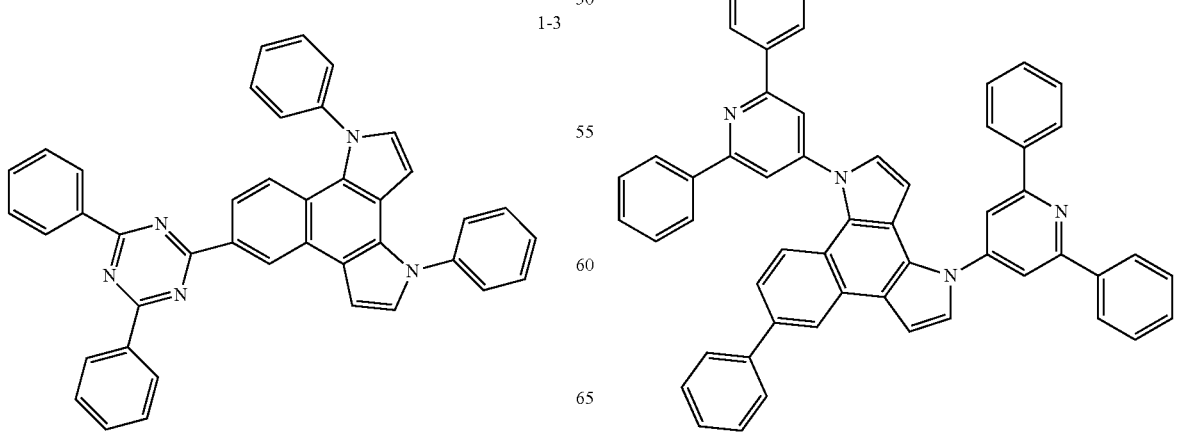

2-12

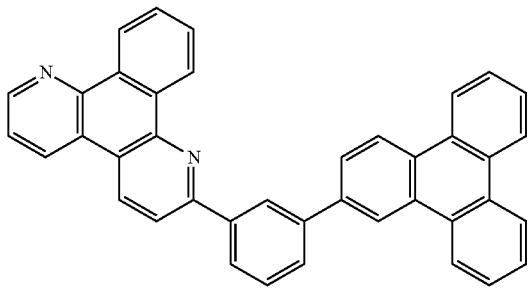

[Chemical Formula C]

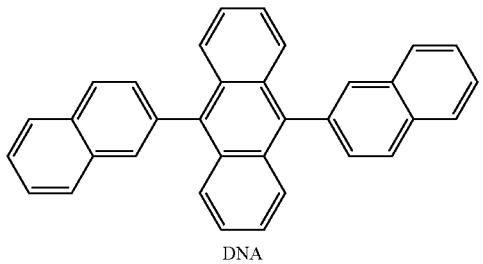

DNA

Comparative Example 1

An organic light emitting diode device was manufactured in accordance with the same procedure as in Example 1, except using a red phosphorescent dopant of (piq)$_2$Ir(acac) (D1) and a compound 1-1 at a weight ratio of 10:90 for forming the emission layer.

Evaluation

The characteristics of organic light emitting diode devices obtained from Examples 1 to 6 and Comparative Examples 1 to 3 were evaluated.

The results are shown in Table 1.

TABLE 1

|  | First host (Chemical Formula 1) | Second host (Chemical Formula 2) | Dopant | Ratio (first host: second host: dopant) | Current density (mA/cm$^2$) | Efficiency (cd/A) | Life-span (T90%) (h) |
| --- | --- | --- | --- | --- | --- | --- | --- |
| Example 1 | 1-1 | 2-1 | D1 | 70:20:10 | 10 | 21.5 | 139 |
| Example 2 | 1-1 | 2-1 | D1 | 45:45:10 | 10 | 24.2 | 36 |
| Example 3 | 1-1 | 2-1 | D1 | 20:70:10 | 10 | 28.2 | 18 |
| Example 4 | 1-3 | 2-1 | D1 | 45:45:10 | 10 | 18.1 | 15 |
| Example 5 | 1-5 | 2-8 | D1 | 45:45:10 | 10 | 14.9 | 42 |
| Example 6 | 1-6 | 2-12 | D1 | 45:45:10 | 10 | 19.4 | 28 |
| Comparative Example 1 | 1-1 | — | D1 | 90:0:10 | 10 | 12.3 | 56 |
| Comparative Example 2 | — | 2-1 | D1 | 90:0:10 | 10 | 22.5 | 12 |
| Comparative Example 3 | Chemical Formula C | — | D1 | 90:0:10 | 10 | 8.6 | 9 |

(T90% refers to the time (H) for decreasing the luminance into 90% when driving the organic light emitting diode device while continuously applying the current density of 10 mA/cm$^2$ at the initial luminance of 100%)

Comparative Example 2

An organic light emitting diode device was manufactured in accordance with the same procedure as in Example 1, except using a red phosphorescent dopant of (piq)$_2$Ir(acac) (D1) and a compound 2-1 at a weight ratio of 10:90 for forming the emission layer.

Comparative Example 3

An organic EL device was manufactured in accordance with the same procedure as in Comparative Example 1, except using a known host of 9,10-di(2-naphthyl)anthracene (hereinafter, DNA) represented by the following Chemical Formula C instead of the compound 1-1 for forming the emission layer.

Referring to Table 1, it is confirmed that the organic light emitting diode device according to Comparative Example 1 remarkably deteriorated in efficiency; the organic light emitting diode device according to Comparative Example 2 remarkably deteriorated in life-span characteristics; the organic light emitting diode device according to Comparative Example 3 remarkably deteriorated in efficiency and life-span characteristics; and the organic light emitting diode devices according to Examples 1 to 6 simultaneously satisfied the efficiency and life-span characteristics.

By way of summation and review, an organic light emitting diode device may include two electrodes and an emission layer disposed therebetween, and may emit a light when electrons injected from one electrode are combined with holes injected from the other electrode and thus, form excitons and emit energy.

As described above, an embodiment may provide an organic light emitting diode device having improved efficiency and life-span characteristics. An organic light emitting diode device having high efficiency, a low voltage, high luminance, and long life-span may be provided by providing mixing organic materials having backbones having desired color coordinates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
|---|---|
| 1: lower electrode; | 2: upper electrode; |
| 3: lower auxiliary layer; | 4: upper auxiliary layer |
| 5: emission layer | |

What is claimed is:

1. An organic light emitting diode device, comprising:
an anode and a cathode facing each other, and
an emission layer interposed between the anode and cathode, the emission layer including a compound represented by the following Chemical Formula 1 and a compound represented by the following Chemical Formula 2:

[Chemical Formula 1]

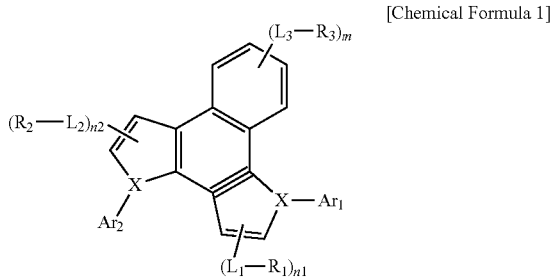

wherein, in Chemical Formula 1,
each X is independently oxygen (O), sulfur (S), or nitrogen (N),
$L_1$ to $L_3$ are independently a single bond, a substituted or unsubstituted C6 to C30 arylene group, or a substituted or unsubstituted C2 to C30 heteroarylene group,
$R_1$ to $R_3$ are independently hydrogen, a substituted or unsubstituted C1 to C30 alkyl group, a substituted or unsubstituted C1 to C30 haloalkyl group, a halogen, a cyano group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 alkoxy group, a substituted or unsubstituted C6 to C30 aryloxy group, a substituted or unsubstituted C2 to C30 heteroaryl group, a substituted or unsubstituted C6 to C30 arylthiol group, a substituted or unsubstituted amino group, a substituted or unsubstituted silyl group, a nitro group, or a hydroxy group,
$Ar_1$ and $Ar_2$ are independently a substituted or unsubstituted C1 to C30 alkyl group, a substituted or unsubstituted C1 to C30 haloalkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C1 to C30 alkoxy group, a substituted or unsubstituted C6 to C30 aryloxy group, a substituted or unsubstituted C2 to C30 heteroaryl group, a substituted or unsubstituted C6 to C30 arylthiol group, a substituted or unsubstituted amino group, or a substituted or unsubstituted silyl group, and
n1 and n2 indicate ring substitutions and are independently integers ranging from 0 to 2, and m indicates ring substitutions and is an integer ranging from 0 to 4,

[Chemical Formula 2]

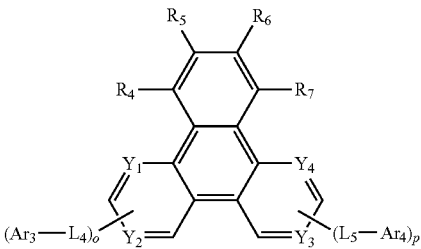

wherein, in Chemical Formula 2,
$R_4$ to $R_7$ are independently hydrogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C40 aryl group, a substituted or unsubstituted C2 to C40 heteroaryl group, a substituted or unsubstituted C6 to C40 aryloxy group, a substituted or unsubstituted C1 to C40 alkoxy group, a substituted or unsubstituted C6 to C40 arylamino group, a substituted or unsubstituted C3 to C40 cycloalkyl group, or a substituted or unsubstituted C2 to C40 heterocycloalkyl group,
$Y_1$ to $Y_4$ are independently nitrogen (N) or $CR_8$, wherein $R_8$ is hydrogen, a C1 to C40 alkyl group, a C6 to C40 aryl group, or a C2 to C40 heteroaryl group,
$L_4$ and $L_5$ are independently a single bond, a substituted or unsubstituted C6 to C30 arylene group, or a substituted or unsubstituted C2 to C30 heteroarylene group,
$Ar_3$ and $Ar_4$ are independently a substituted or unsubstituted C6 to C40 aryl group, a substituted or unsubstituted C2 to C40 heteroaryl group, or a substituted or unsubstituted silyl group, and
o and p indicate ring substitutions are independently integers ranging from 0 to 3, provided that o and p are not simultaneously 0.

2. The organic light emitting diode device of claim 1, wherein:
each X is independently sulfur (S) or nitrogen (N),
$L_1$ to $L_3$ are independently a single bond, a substituted or unsubstituted C6 to C30 arylene group, or a substituted or unsubstituted C2 to C30 heteroarylene group,
$R_1$ to $R_3$ are independently a substituted or unsubstituted C6 to C30 aryl group, a substituted or unsubstituted C2 to C30 heteroaryl group, or a substituted or unsubstituted silyl group, and
$Ar_1$ and $Ar_2$ are a substituted or unsubstituted C6 to C30 aryl group, or a substituted or unsubstituted C2 to C30 heteroaryl group.

3. The organic light emitting diode device of claim 1, wherein all $R_4$ to $R_7$ are hydrogen, $Y_1$ to $Y_4$ are independently nitrogen (N) or $CR_8$, wherein $R_8$ is hydrogen, a C1 to C40 alkyl group, a C6 to C40 aryl group, or a C2 to C40 heteroaryl group, $L_4$ and $L_5$ are independently a single bond, a substituted or unsubstituted C6 to C30 arylene group, or a substituted or unsubstituted C2 to C30 heteroarylene group, o is 0 or 1, p is 1, and $Ar_3$ and $Ar_4$ are independently a substituted or unsubstituted C6 to C40 aryl group, a substituted or unsubstituted C2 to C40 heteroaryl group, or a substituted or unsubstituted silyl group.

4. The organic light emitting diode device of claim 1, wherein the compound represented by the above Chemical Formula 1 is at least one of the compounds of the following Group 1:

[Group 1]

1-1
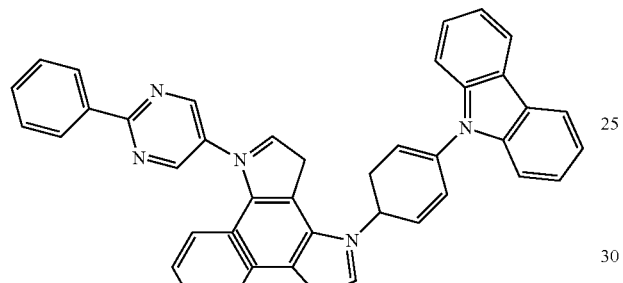

1-2
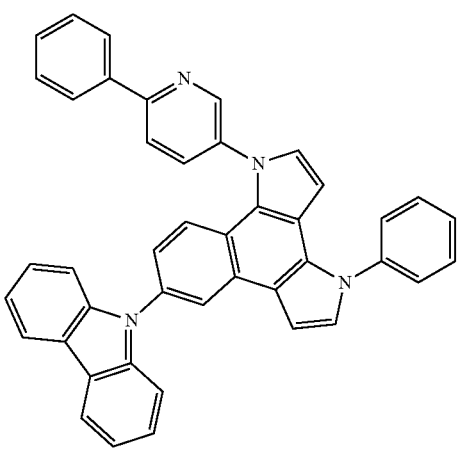

1-3
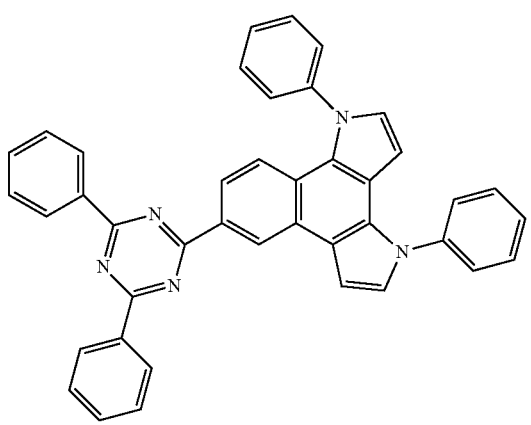

1-4
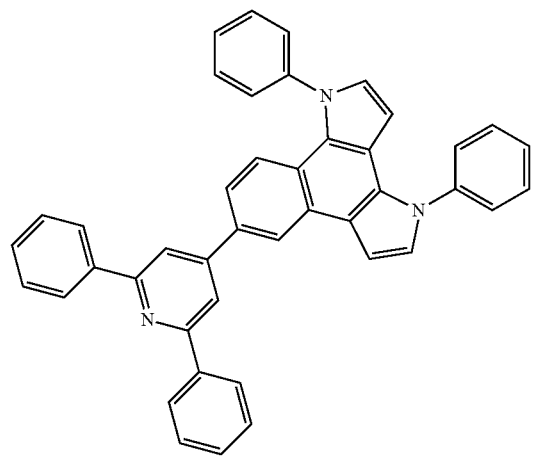

1-5
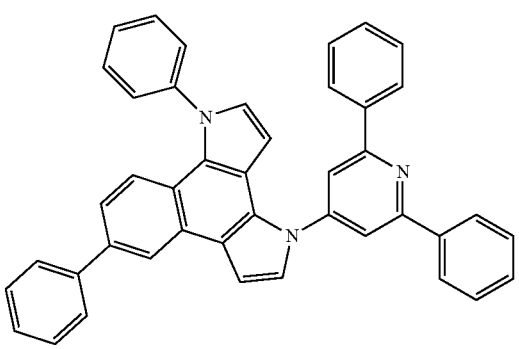

1-6
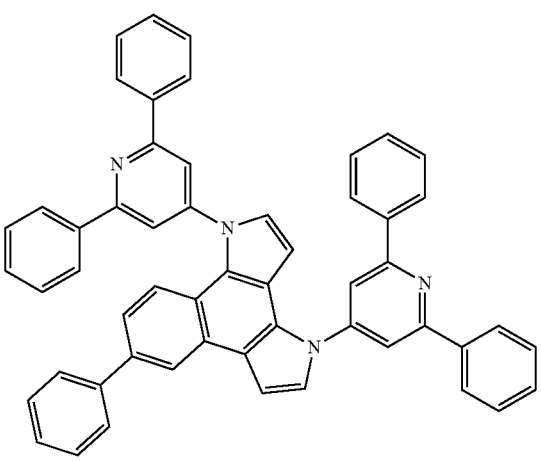

1-7
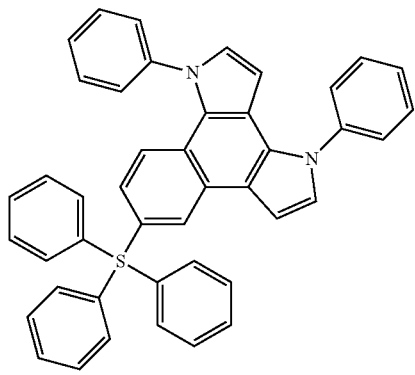
1-8
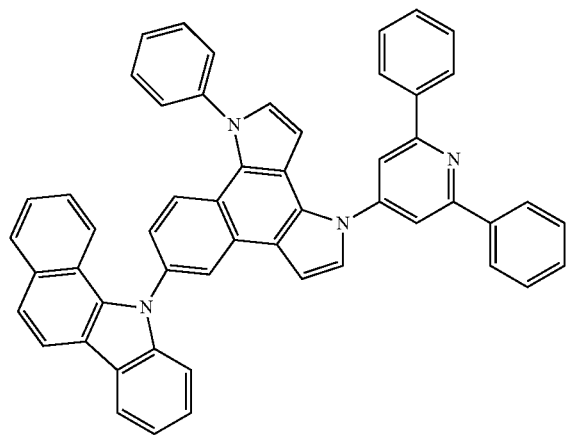
1-9
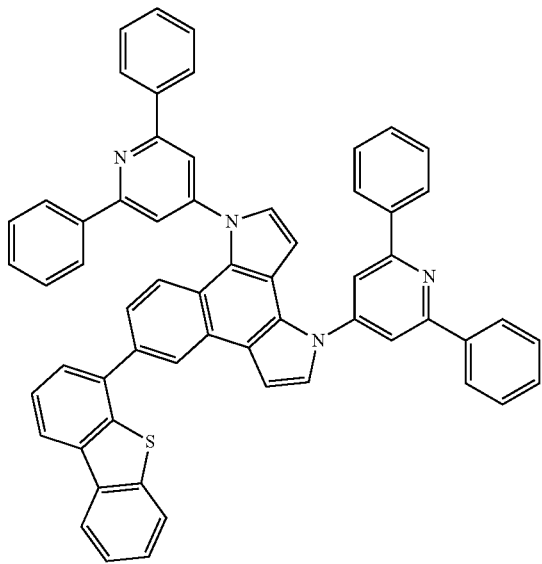
1-10
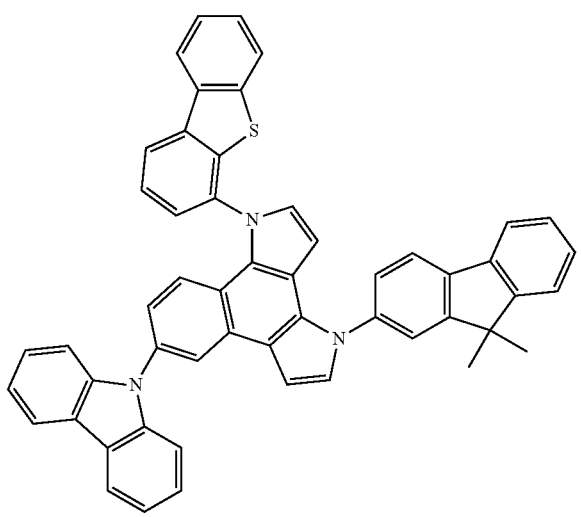
1-11
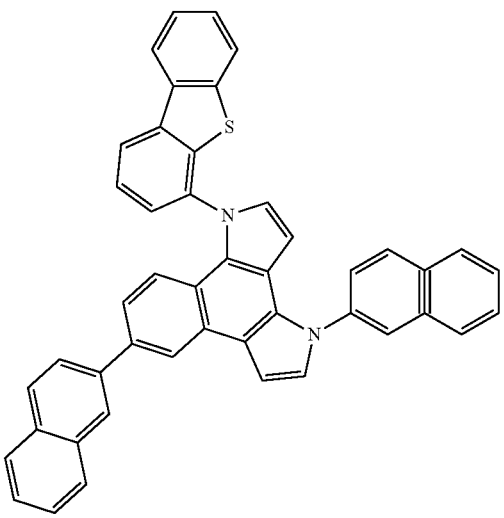
1-12

1-13
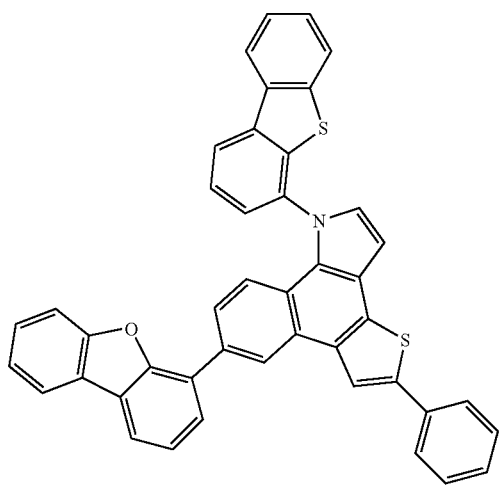
1-14
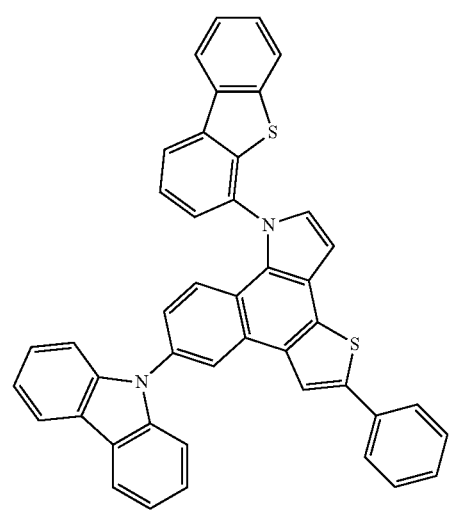
1-15
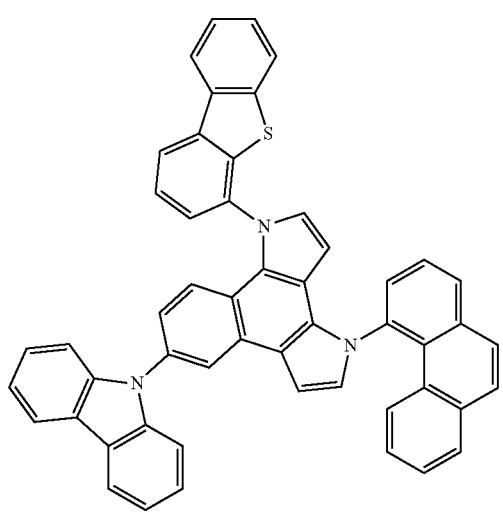
1-16
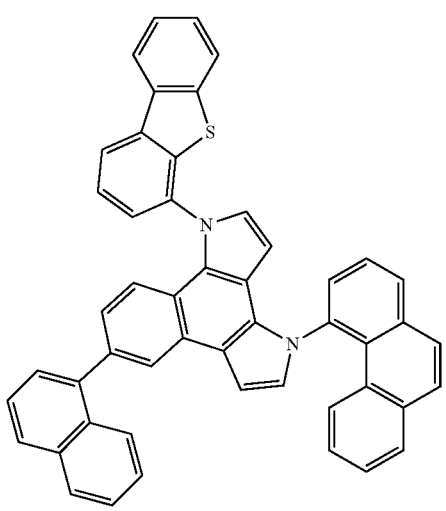
1-17
1-18
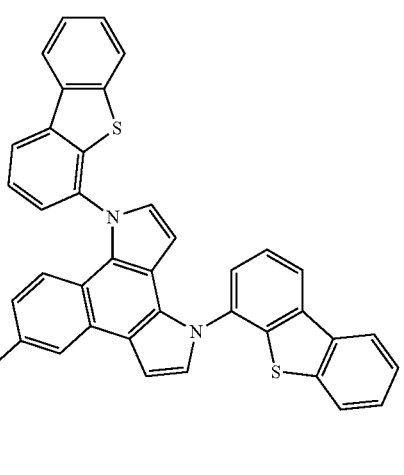

-continued
1-19
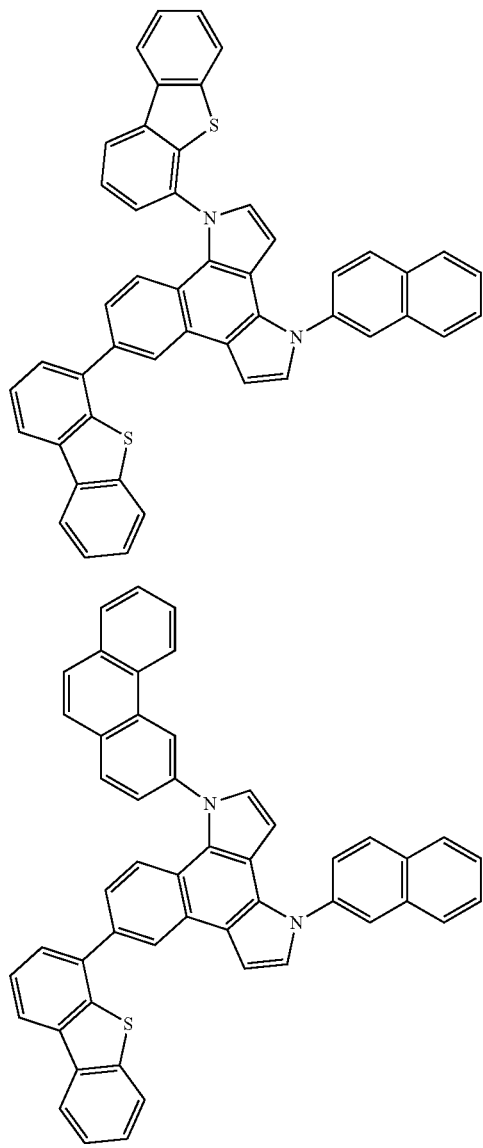
1-20
1-21
5. The organic light emitting diode device of claim 1, wherein the compound represented by the above Chemical Formula 2 is at least one of the compounds of the following Group 2:
[Group 2]
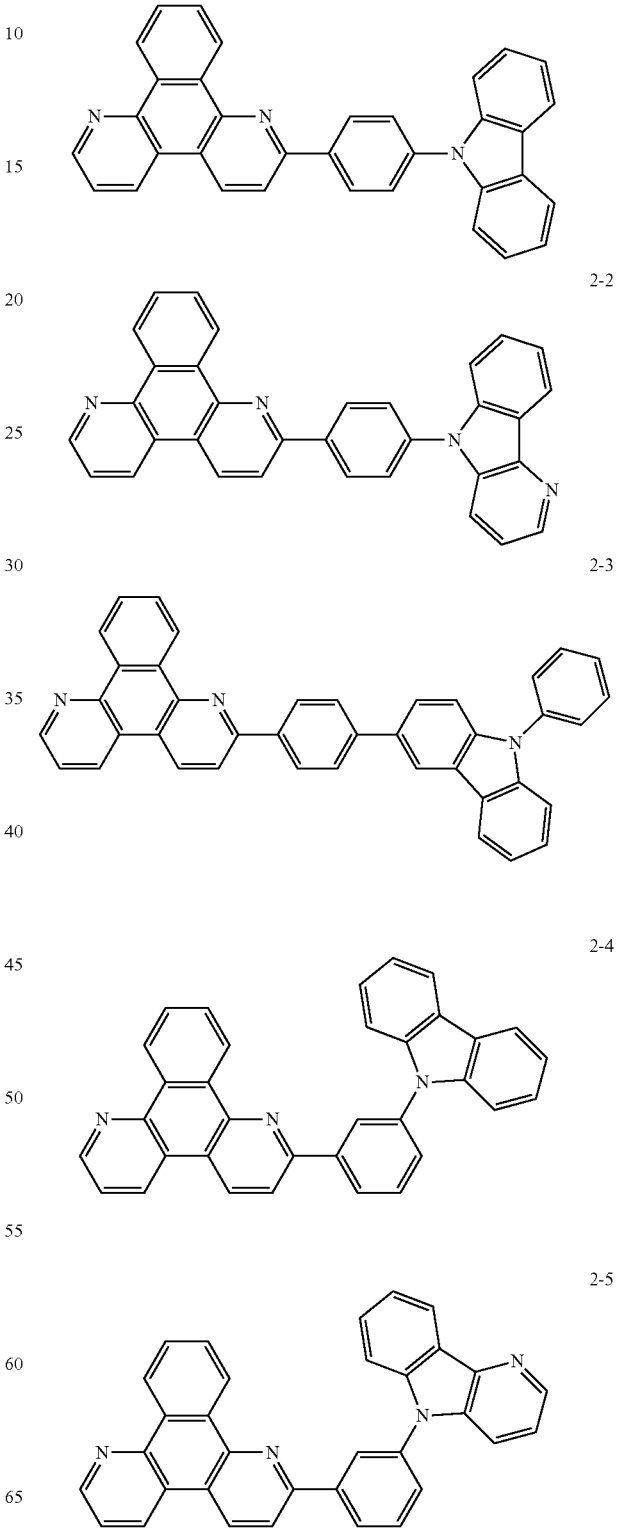

2-6
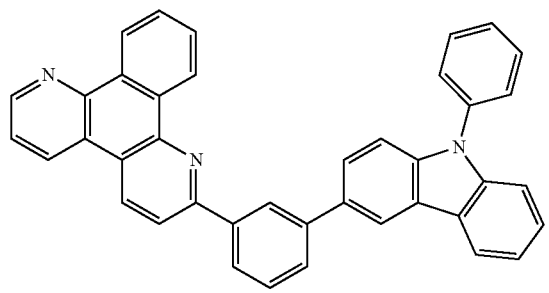
2-7
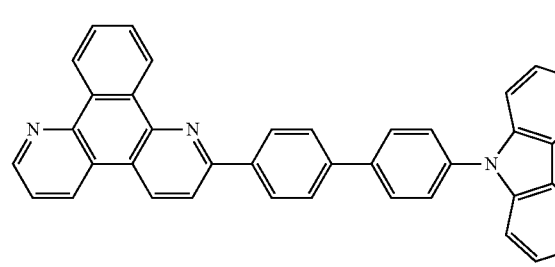
2-8
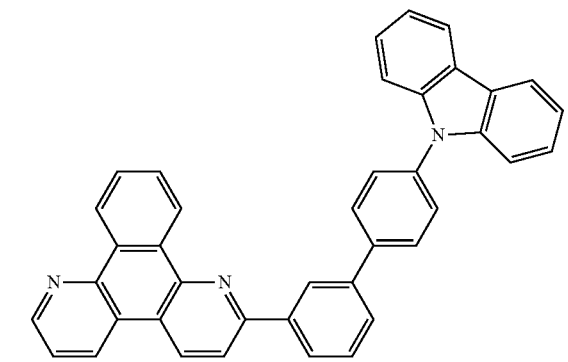
2-9
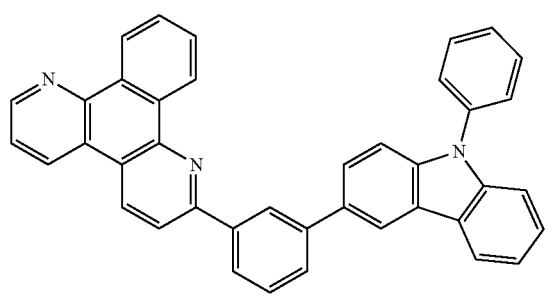
2-10
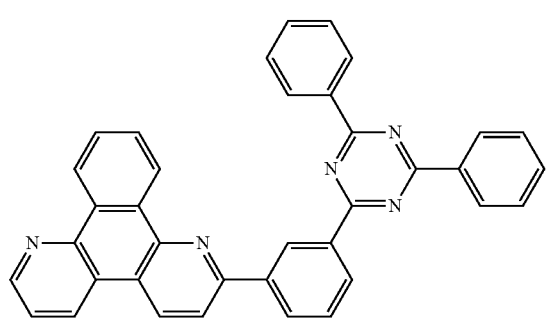
2-11
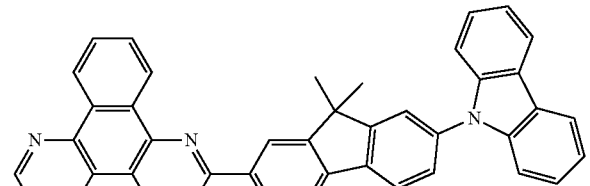
2-12
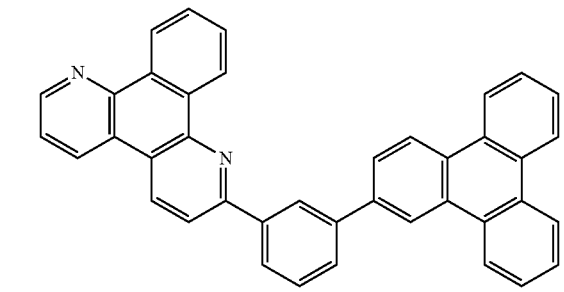
2-13
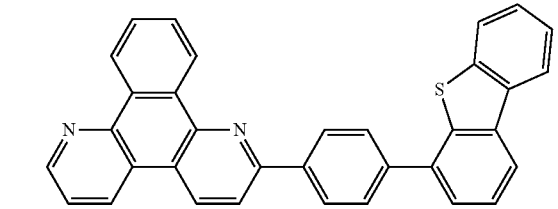
2-14
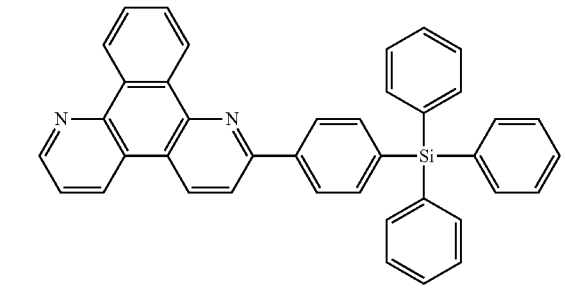
2-15
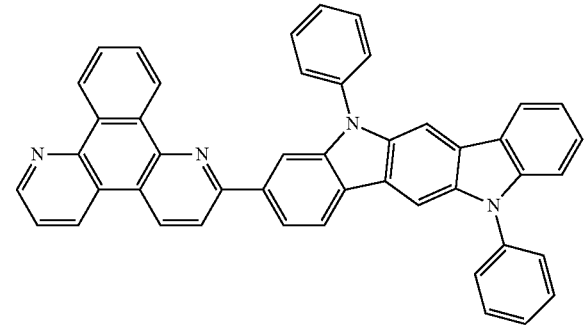

2-16
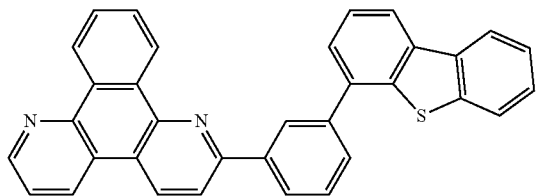
2-16
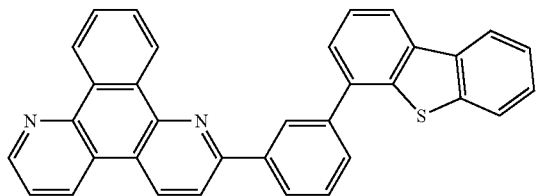
2-17
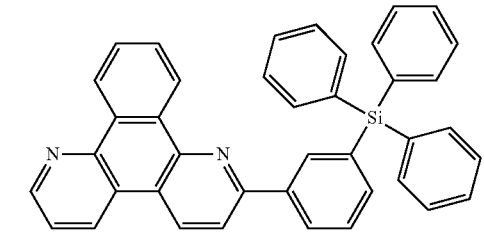
2-18
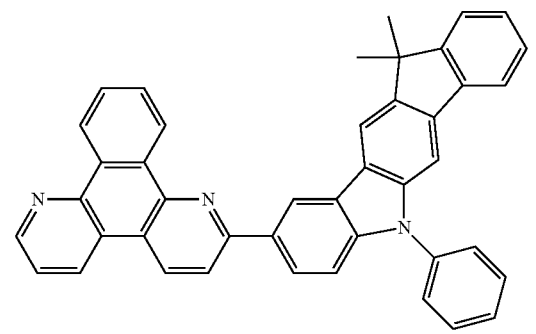
2-19
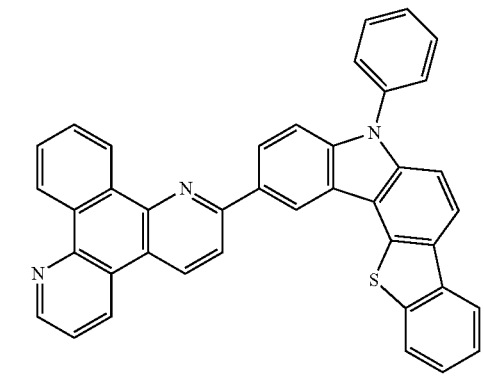
2-20
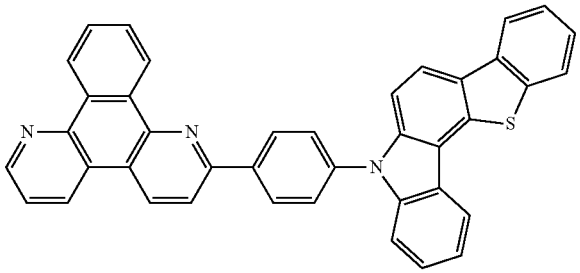
2-21
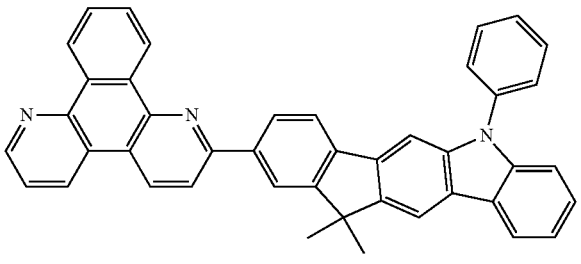
2-22
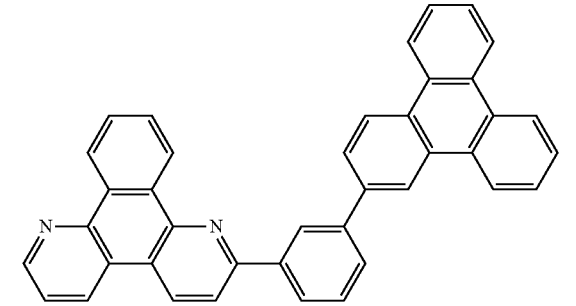
2-23
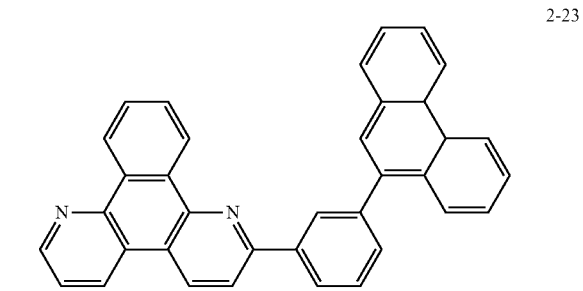
2-24
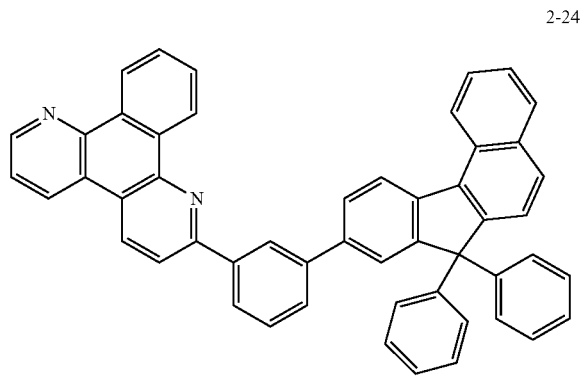

-continued 2-25
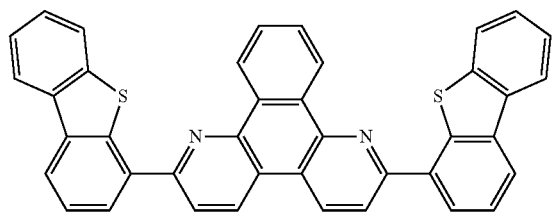

2-26
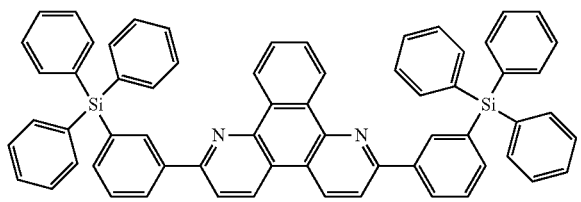

2-27
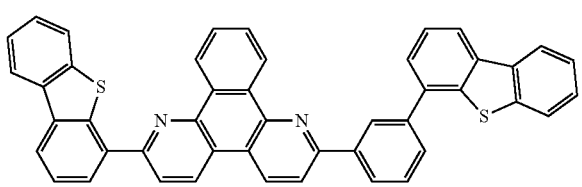

2-28
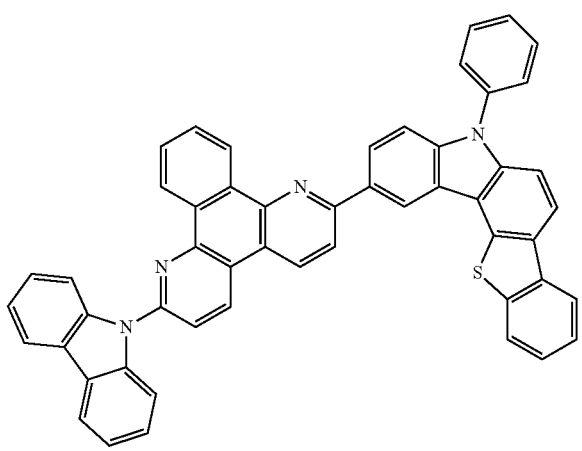

-continued 2-29
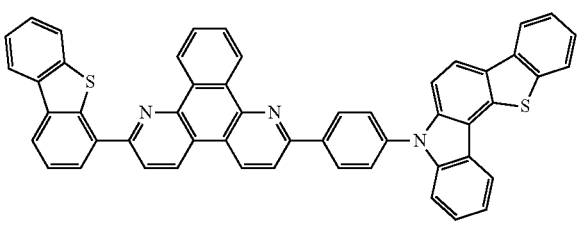

2-30
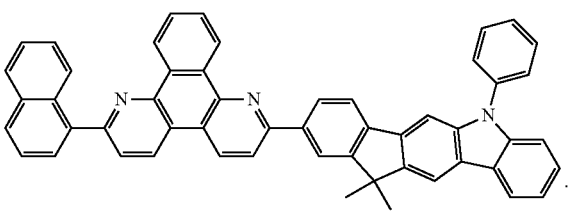

6. The organic light emitting diode device of claim 1, wherein the emission layer includes, as a host material, the compounds represented by Chemical Formulae 1 and 2.

7. The organic light emitting diode device of claim 6, wherein the emission layer further includes, as a dopant material, a phosphorescent material.

8. The organic light emitting diode device of claim 6, wherein the compounds represented by Chemical Formulae 1 and 2 are included in a weight of about 1:9 to about 9:1.

9. The organic light emitting diode device of claim 6, wherein the emission layer further includes a dopant material, and the host material and the dopant material are included in a weight of about 6:4 to about 9:1.

* * * * *